(12) United States Patent
Fuse et al.

(10) Patent No.: US 8,664,116 B2
(45) Date of Patent: Mar. 4, 2014

(54) HEAT TREATMENT METHOD FOR GROWING SILICIDE

(75) Inventors: Kazuhiko Fuse, Kyoto (JP); Shinichi Kato, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 0 days.

(21) Appl. No.: 13/606,281

(22) Filed: Sep. 7, 2012

(65) Prior Publication Data

US 2013/0078802 A1 Mar. 28, 2013

(30) Foreign Application Priority Data

Sep. 26, 2011 (JP) ................................. 2011-209107
Jul. 9, 2012 (JP) ................................. 2012-153158

(51) Int. Cl.
*H01L 21/44* (2006.01)

(52) U.S. Cl.
USPC ........... 438/660; 438/799; 438/795; 438/761; 438/758; 438/530; 257/E21.575; 257/E21.333; 257/E21.347; 257/E21.214; 257/E21.211

(58) Field of Classification Search
USPC ......... 438/660, 799, 795, 761, 758, 530, 514; 257/E21.575, E21.333, E21.347, 257/E21.214, E21.211
See application file for complete search history.

(56) References Cited

U.S. PATENT DOCUMENTS

| 6,335,289 | B1* | 1/2002 | Kikuchi | 438/702 |
|---|---|---|---|---|
| 2005/0112854 | A1* | 5/2005 | Ito et al. | 438/527 |
| 2005/0227463 | A1* | 10/2005 | Ito et al. | 438/527 |
| 2007/0254461 | A1* | 11/2007 | Wei et al. | 438/514 |
| 2009/0001371 | A1* | 1/2009 | Mowry et al. | 257/51 |
| 2009/0068824 | A1* | 3/2009 | Liu et al. | 438/530 |
| 2009/0242891 | A1* | 10/2009 | Mitsuhashi et al. | 257/66 |
| 2009/0263112 | A1 | 10/2009 | Kiyama et al. | 392/418 |
| 2009/0285568 | A1 | 11/2009 | Kiyama et al. | 392/418 |
| 2010/0087052 | A1* | 4/2010 | Xu | 438/530 |
| 2010/0297856 | A1* | 11/2010 | Moffatt et al. | 438/795 |
| 2011/0039390 | A1* | 2/2011 | Nieh et al. | 438/305 |
| 2011/0262115 | A1* | 10/2011 | Yokouchi | 392/407 |
| 2012/0114316 | A1 | 5/2012 | Kiyama et al. | 392/407 |
| 2012/0208377 | A1* | 8/2012 | Timans | 438/799 |

FOREIGN PATENT DOCUMENTS

JP 2011-014567 1/2011

* cited by examiner

*Primary Examiner* — N Drew Richards
*Assistant Examiner* — Ankush Singal
(74) *Attorney, Agent, or Firm* — Ostrolenk Faber LLP

(57) ABSTRACT

Ions of silicon are implanted into source/drain regions in a semiconductor wafer to amorphize an ion implantation region in the semiconductor wafer. A nickel film is deposited on the amorphized ion implantation region. First irradiation from a flash lamp is performed on the semiconductor wafer with the nickel film deposited thereon to increase the temperature of a front surface of the semiconductor wafer from a preheating temperature to a target temperature for a time period in the range of 1 to 20 milliseconds. Subsequently, second irradiation from the flash lamp is performed to maintain the temperature of the front surface of the semiconductor wafer within a ±25° C. range around the target temperature for a time period in the range of 1 to 100 milliseconds. This causes nickel silicide to grow preferentially in a direction perpendicular to the semiconductor wafer.

8 Claims, 16 Drawing Sheets

F I G . 4
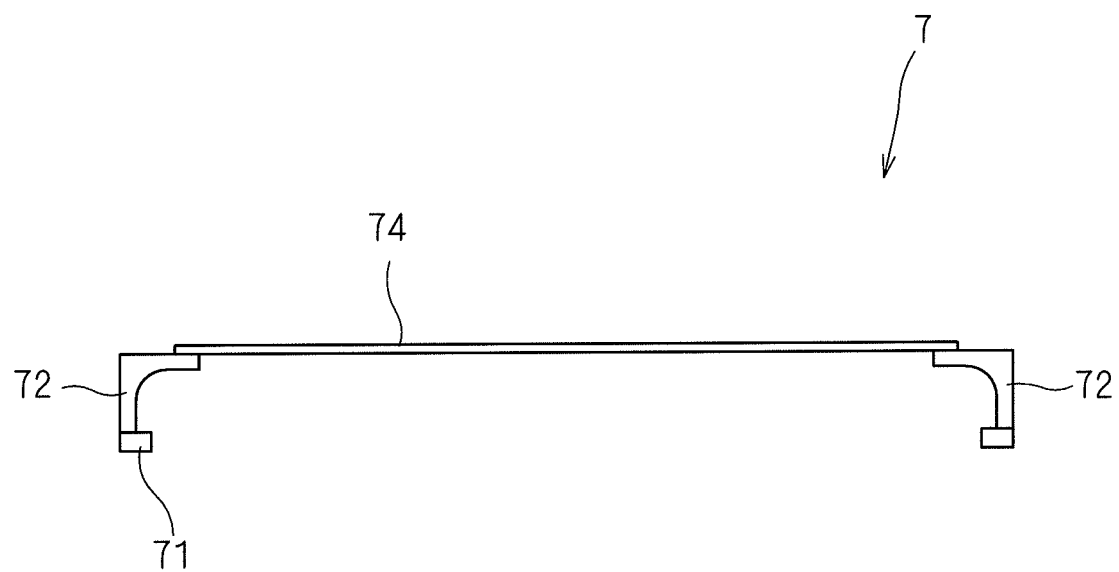

F I G. 5
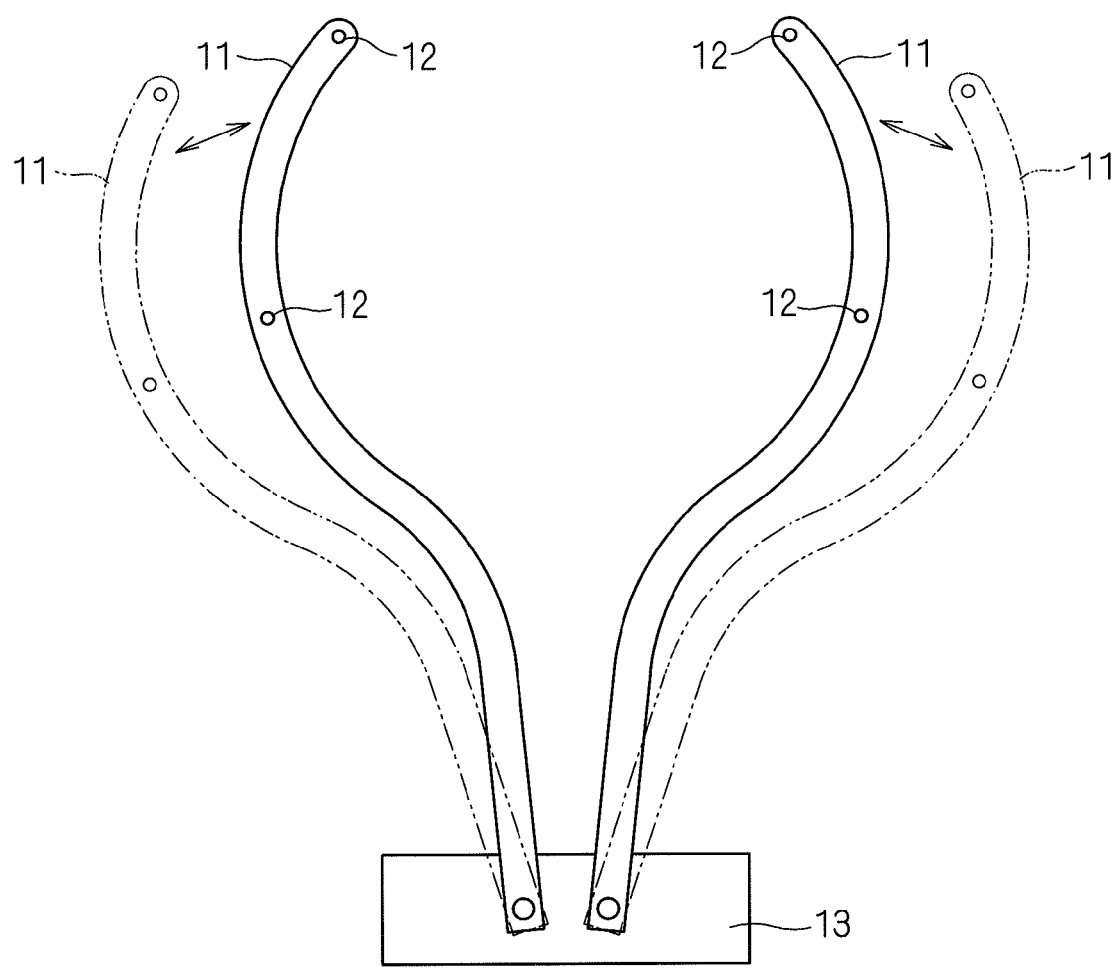

F I G. 7
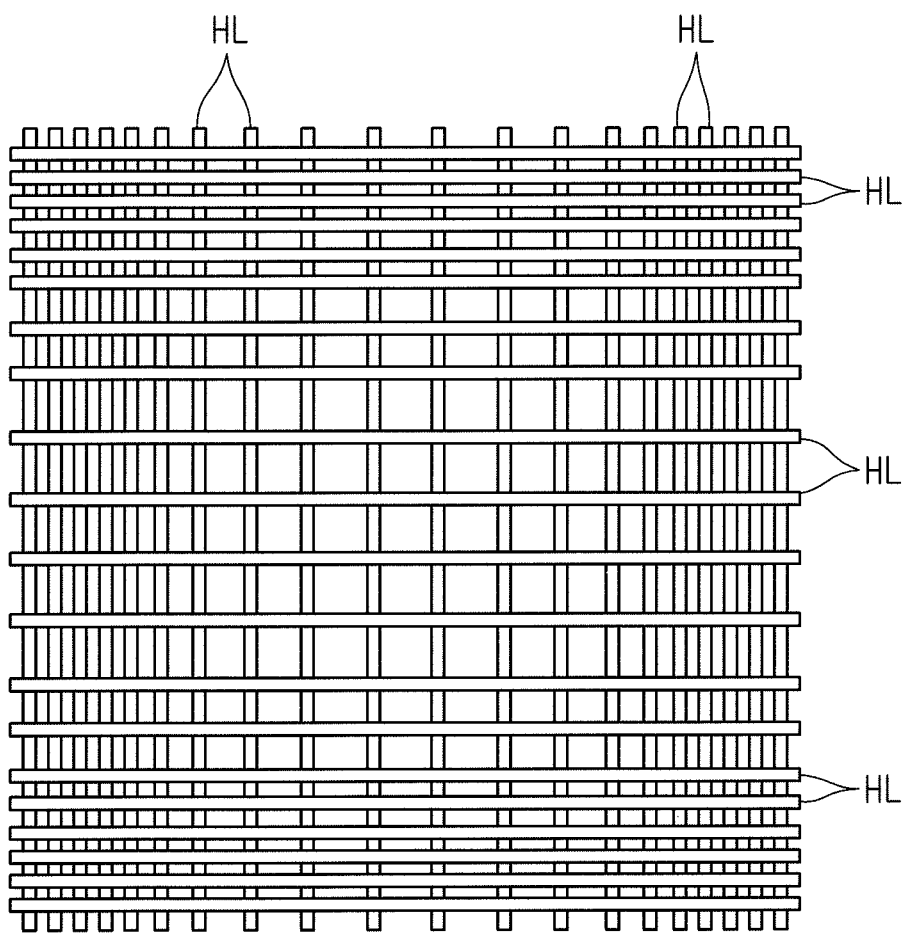

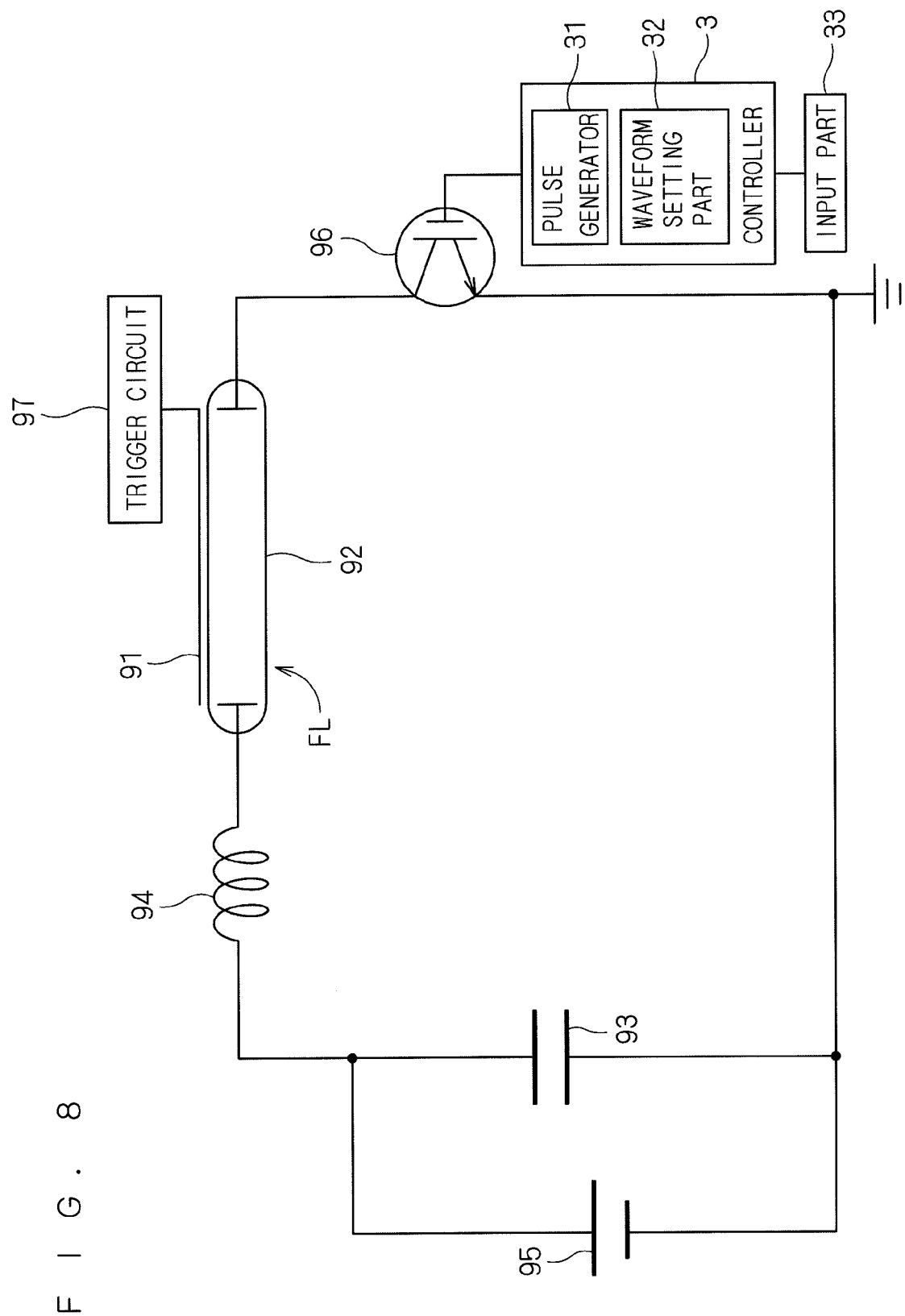
F I G . 8

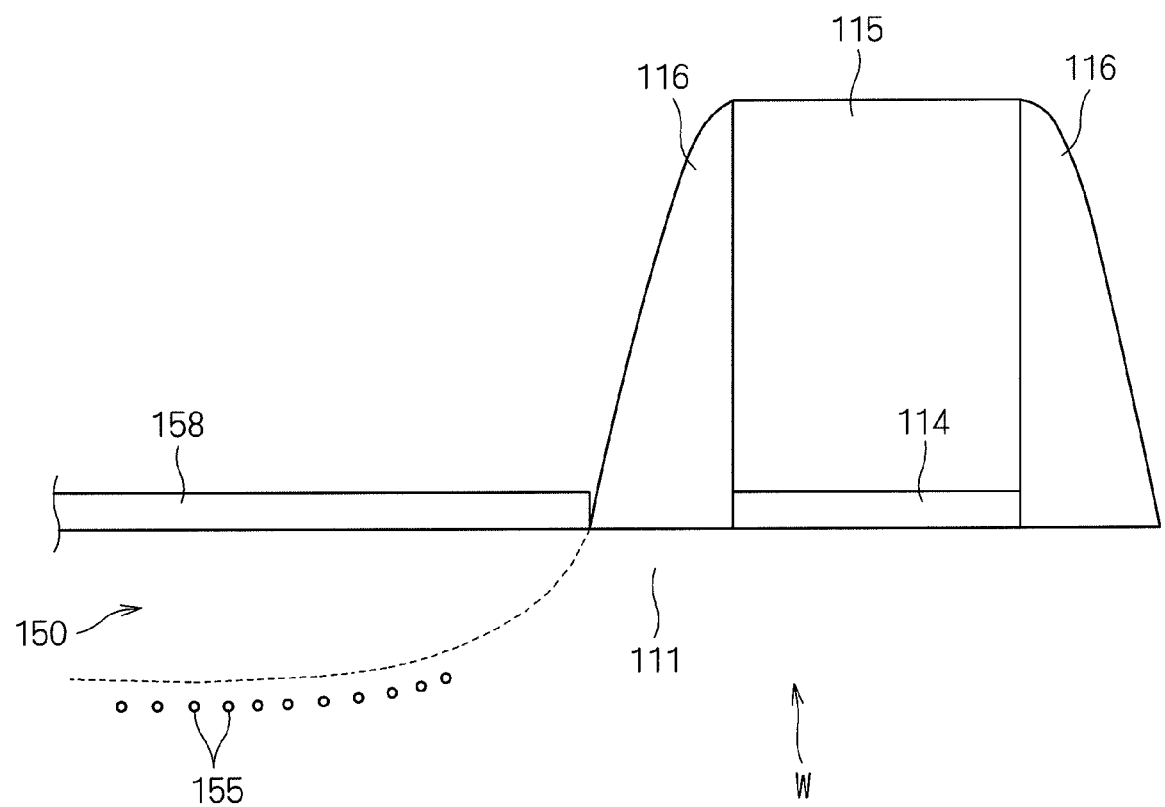
F I G . 1 1

F I G . 1 3
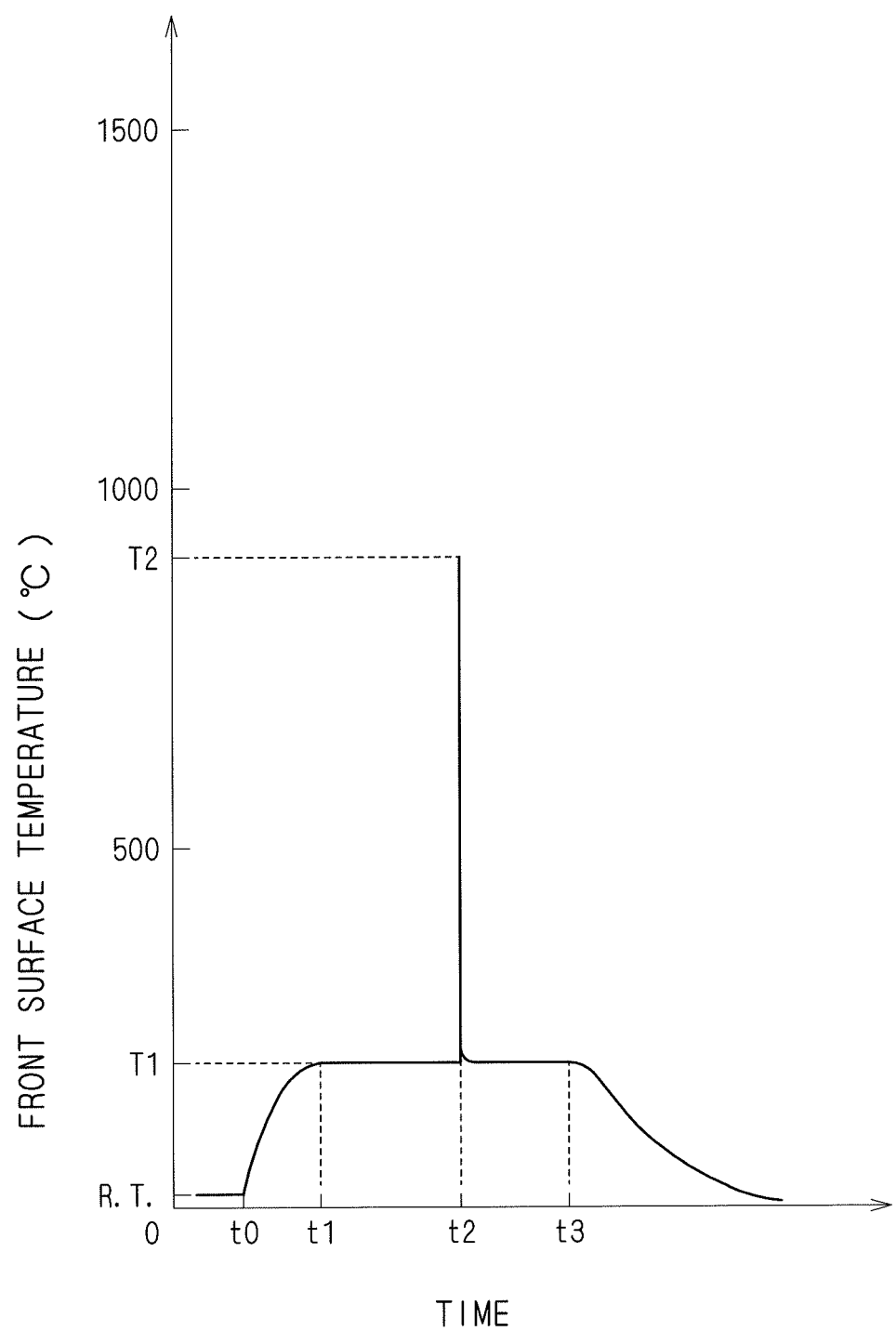

F I G . 1 6
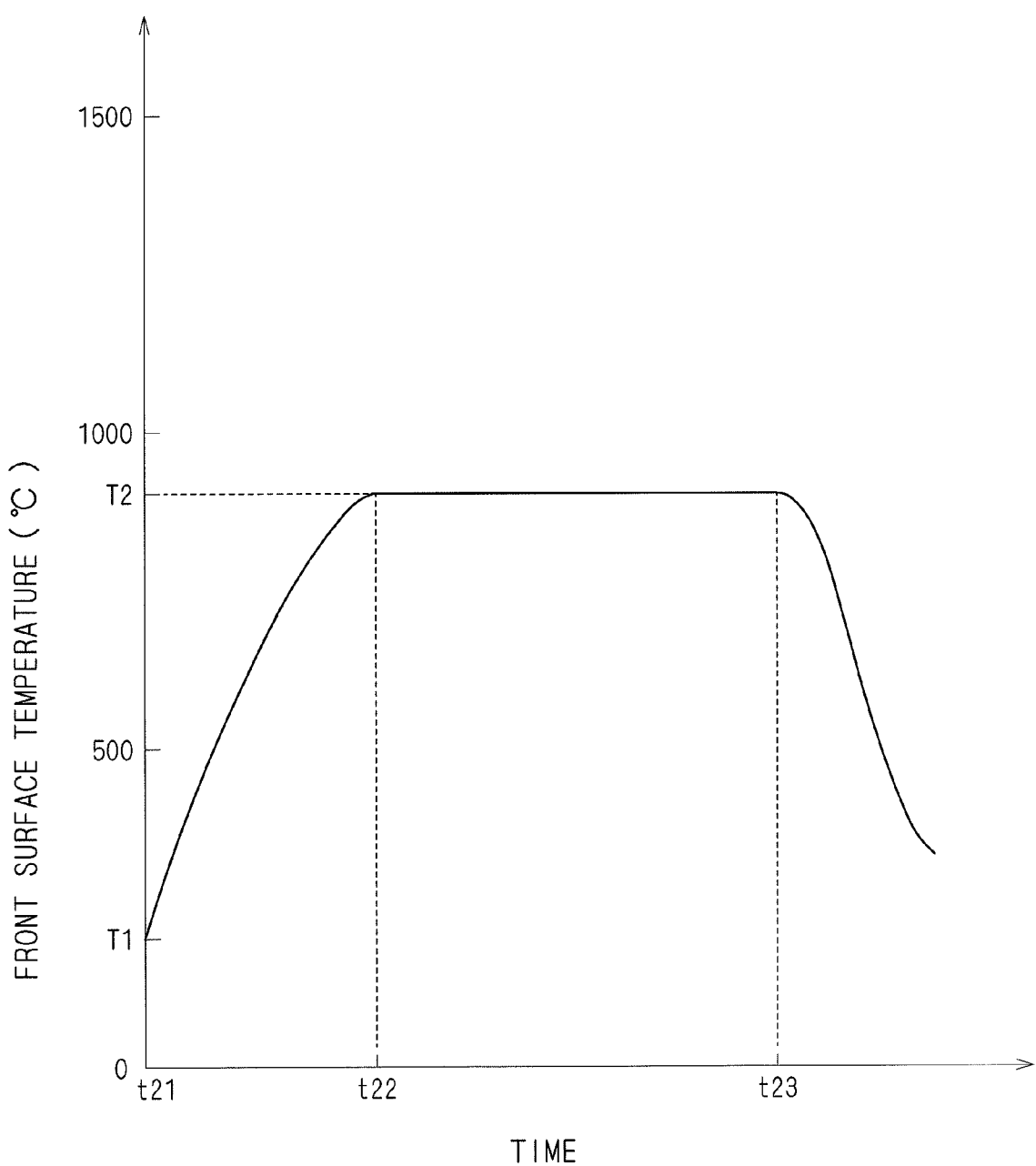

HEAT TREATMENT METHOD FOR GROWING SILICIDE

BACKGROUND OF THE INVENTION

1. Field of the Invention

The present invention relates to a heat treatment method which irradiates a silicon substrate such as a semiconductor wafer with light to heat the substrate, thereby growing a silicide.

2. Description of the Background Art

Silicide technology that forms compounds (silicides) of silicon with metals for the purpose of increasing the performance of field-effect transistors (FETs) has been known. The formation of silicides reduces resistances in gates and source/drain regions to achieve the high-speed operation of the field-effect transistors. Examples of the metals that form silicides which are under study include nickel (Ni), cobalt (Co), and titanium (Ti). In particular, nickel is promising as the most suitable material for finer geometries. Japanese Patent Application Laid-Open No. 2011-14567 discloses a technique in which a nickel film is deposited on a silicon layer and heat treatment is performed using an electric furnace or a lamp annealer to form nickel silicide.

Conventionally, the heat treatment for the formation of nickel silicide requires treatment time in the range of tens of seconds to 100 minutes or more. In the silicide technology, for example, disclosed in Japanese Patent Application Laid-Open No. 2011-14567, the heat treatment time is not less than 15 minutes and is less than 120 minutes when the electric furnace is used, and the heat treatment time is not less than 15 seconds and is not more than 5 minutes when the lamp annealer is used.

However, when the heat treatment is performed for such a long time, the nickel silicide abnormally grows laterally (in a direction from the source/drain regions to the gate) to break through source/drain junctions, thereby giving rise to a problem in that leakage current increases rapidly.

SUMMARY OF THE INVENTION

The present invention is intended for a method of heating a substrate of silicon to grow a silicide.

According to an aspect of the present invention, the method comprises the steps of: (a) implanting ions into the substrate to amorphize an ion implantation region in the substrate; (b) depositing a metal film on the amorphized ion implantation region; (c) heating the substrate with the metal film formed thereon at a predetermined preheating temperature; (d) irradiating the substrate with light to increase the temperature of a front surface of the substrate from the preheating temperature to a target temperature for a time period in the range of 1 to 20 milliseconds; and (e) irradiating the substrate with light to maintain the temperature of the front surface of the substrate within a ±25° C. range around the target temperature for a time period in the range of 1 to 100 milliseconds, the step (e) being performed after the step (d).

The silicide grows preferentially in a direction perpendicular to the substrate. The formation of the silicide is achieved while the abnormal lateral growth of the silicide is prevented. Also, point defects introduced in the ion implantation step are reduced.

Preferably, a switching element intermittently supplies electrical charges from a capacitor to a flash lamp to control an emission output from the flash lamp in the step (d) and in the step (e).

The temperature of the front surface of the substrate is maintained near the target temperature with stability.

It is therefore an object of the present invention to form a silicide while preventing the abnormal lateral growth of the silicide.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a side view of the holder as seen from one side;

FIG. 5 is a plan view of a transfer mechanism;

FIG. 7 is a plan view showing an arrangement of halogen lamps;

FIG. 8 is a diagram showing a driving circuit for a flash lamp;

FIG. 11 is a view showing a nickel film deposited on an ion implantation region;

FIG. 13 is a graph showing changes in the temperature of the front surface of a semiconductor wafer;

FIG. 16 is a graph showing an example of a temperature profile of the front surface of a semiconductor wafer.

DESCRIPTION OF THE PREFERRED EMBODIMENTS

A preferred embodiment according to the present invention will now be described in detail with reference to the drawings.

Figure 1:
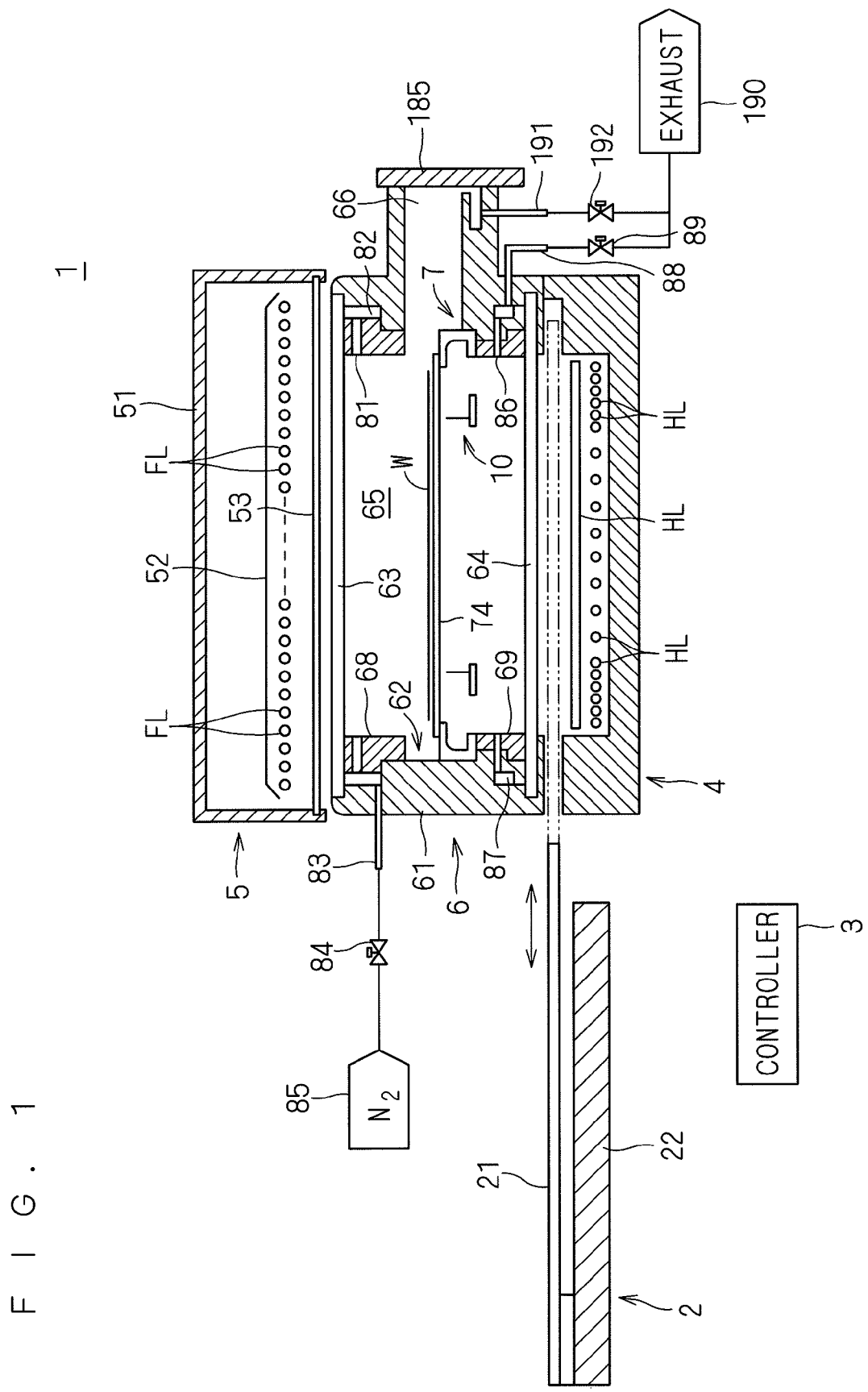
FIG. 1 is a longitudinal sectional view showing a configuration of a heat treatment apparatus.

FIG. 1 is a longitudinal sectional view showing a configuration of a heat treatment apparatus 1 for carrying out a heat treatment method according to the present invention. The heat treatment apparatus 1 according to the present preferred embodiment is a flash lamp annealer for irradiating a disk-shaped semiconductor wafer W having a diameter of 300 mm and serving as a substrate with a flash of light to heat the semiconductor wafer W. A semiconductor wafer W prior to the transport into the heat treatment apparatus 1 includes a nickel film deposited thereon, and the heat treatment apparatus 1 performs a heating treatment on the semiconductor wafer W to thereby form nickel silicide, which will be described in detail later.

The heat treatment apparatus 1 includes a chamber 6 for receiving a semiconductor wafer W therein, a flash heating part 5 including a plurality of built-in flash lamps FL, a halogen heating part 4 including a plurality of built-in halogen lamps HL, and a shutter mechanism 2. The flash heating part 5 is provided over the chamber 6, and the halogen heating part 4 is provided under the chamber 6. The heat treatment apparatus 1 further includes a holder 7 provided inside the chamber 6 and for holding a semiconductor wafer W in a horizontal position, and a transfer mechanism 10 provided inside the chamber 6 and for transferring a semiconductor wafer W between the holder 7 and the outside of the heat treatment apparatus 1. The heat treatment apparatus 1 further includes a controller 3 for controlling operating mechanisms provided in the shutter mechanism 2, the halogen heating part 4, the flash heating part 5, and the chamber 6 to cause the operating mechanisms to heat-treat a semiconductor wafer W.

The chamber 6 is configured such that upper and lower chamber windows 63 and 64 made of quartz are mounted to the top and bottom, respectively, of a tubular chamber side portion 61. The chamber side portion 61 has a generally tubular shape having an open top and an open bottom. The upper chamber window 63 is mounted to block the top opening of the chamber side portion 61, and the lower chamber window 64 is mounted to block the bottom opening thereof. The upper chamber window 63 forming the ceiling of the chamber 6 is a disk-shaped member made of quartz, and serves as a quartz window that transmits a flash of light emitted from the flash heating part 5 therethrough into the chamber 6. The lower chamber window 64 forming the floor of the chamber 6 is also a disk-shaped member made of quartz, and serves as a quartz window that transmits light emitted from the halogen heating part 4 therethrough into the chamber 6.

An upper reflective ring 68 is mounted to an upper portion of the inner wall surface of the chamber side portion 61, and a lower reflective ring 69 is mounted to a lower portion thereof. Both of the upper and lower reflective rings 68 and 69 are in the form of an annular ring. The upper reflective ring 68 is mounted by being inserted downwardly from the top of the chamber side portion 61. The lower reflective ring 69, on the other hand, is mounted by being inserted upwardly from the bottom of the chamber side portion 61 and fastened with screws not shown. In other words, the upper and lower reflective rings 68 and 69 are removably mounted to the chamber side portion 61. An interior space of the chamber 6, i.e. a space surrounded by the upper chamber window 63, the lower chamber window 64, the chamber side portion 61, and the upper and lower reflective rings 68 and 69, is defined as a heat treatment space 65.

A recessed portion 62 is defined in the inner wall surface of the chamber 6 by mounting the upper and lower reflective rings 68 and 69 to the chamber side portion 61. Specifically, the recessed portion 62 is defined which is surrounded by a middle portion of the inner wall surface of the chamber side portion 61 where the reflective rings 68 and 69 are not mounted, a lower end surface of the upper reflective ring 68, and an upper end surface of the lower reflective ring 69. The recessed portion 62 is provided in the form of a horizontal annular ring in the inner wall surface of the chamber 6, and surrounds the holder 7 which holds a semiconductor wafer W.

The chamber side portion 61, and the upper and lower reflective rings 68 and 69 are made of a metal material (e.g., stainless steel) with high strength and high heat resistance. The inner peripheral surfaces of the upper and lower reflective rings 68 and 69 are provided as mirror surfaces by electrolytic nickel plating.

The chamber side portion 61 is provided with a transport opening (throat) 66 for the transport of a semiconductor wafer W therethrough into and out of the chamber 6. The transport opening 66 is openable and closable by a gate valve 185. The transport opening 66 is connected in communication with an outer peripheral surface of the recessed portion 62. Thus, when the transport opening 66 is opened by the gate valve 185, a semiconductor wafer W is allowed to be transported through the transport opening 66 and the recessed portion 62 into and out of the heat treatment space 65. When the transport opening 66 is closed by the gate valve 185, the heat treatment space 65 in the chamber 6 is an enclosed space.

At least one gas supply opening 81 for supplying a treatment gas (in this preferred embodiment, nitrogen ($N_2$) gas) therethrough into the heat treatment space 65 is provided in an upper portion of the inner wall of the chamber 6. The gas supply opening 81 is provided above the recessed portion 62, and may be provided in the upper reflective ring 68. The gas supply opening 81 is connected in communication with a gas supply pipe 83 through a buffer space 82 provided in the form of an annular ring inside the side wall of the chamber 6. The gas supply pipe 83 is connected to a nitrogen gas supply source 85. A valve 84 is inserted at some midpoint in the gas supply pipe 83. When the valve 84 is opened, nitrogen gas is fed from the nitrogen gas supply source 85 to the buffer space 82. The nitrogen gas flowing in the buffer space 82 flows in a spreading manner within the buffer space 82 which is lower in fluid resistance than the gas supply opening 81, and is supplied through the gas supply opening 81 into the heat treatment space 65.

On the other hand, at least one gas exhaust opening 86 for exhausting a gas from the heat treatment space 65 is provided in a lower portion of the inner wall of the chamber 6. The gas exhaust opening 86 is provided below the recessed portion 62, and may be provided in the lower reflective ring 69. The gas exhaust opening 86 is connected in communication with a gas exhaust pipe 88 through a buffer space 87 provided in the form of an annular ring inside the side wall of the chamber 6. The gas exhaust pipe 88 is connected to an exhaust part 190. A valve 89 is inserted at some midpoint in the gas exhaust pipe 88. When the valve 89 is opened, the gas in the heat treatment space 65 is exhausted through the gas exhaust opening 86 and the buffer space 87 to the gas exhaust pipe 88. The at least one gas supply opening 81 and the at least one gas exhaust opening 86 may include a plurality of gas supply openings 81 and a plurality of gas exhaust openings 86, respectively, arranged in a circumferential direction of the chamber 6, and may be in the form of slits. The nitrogen gas supply source 85 and the exhaust part 190 may be mechanisms provided in the heat treatment apparatus 1 or be utility systems in a factory in which the heat treatment apparatus 1 is installed.

A gas exhaust pipe 191 for exhausting the gas from the heat treatment space 65 is also connected to a distal end of the transport opening 66. The gas exhaust pipe 191 is connected through a valve 192 to the exhaust part 190. By opening the valve 192, the gas in the chamber 6 is exhausted through the transport opening 66.

Figure 2:
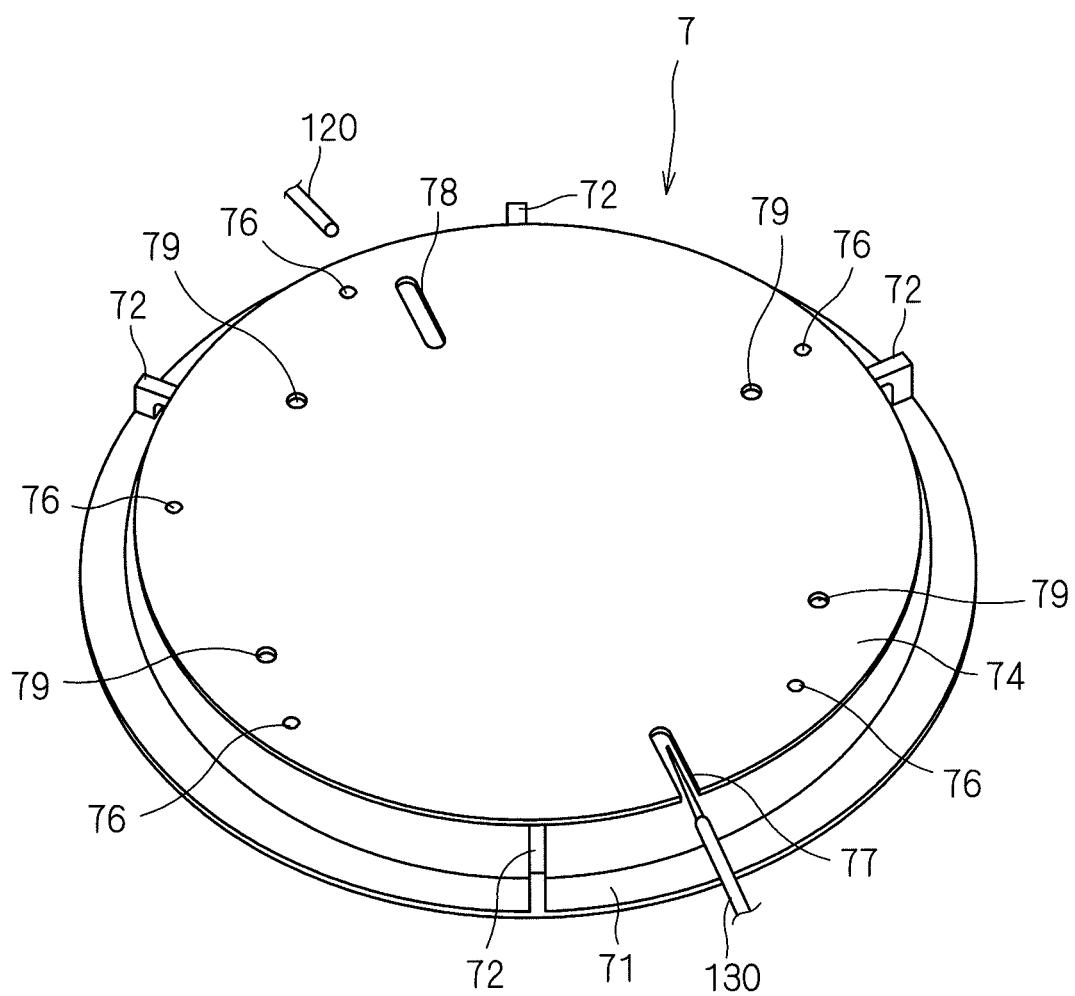
FIG. 2 is a perspective view showing the entire external appearance of a holder.
Figure 3:
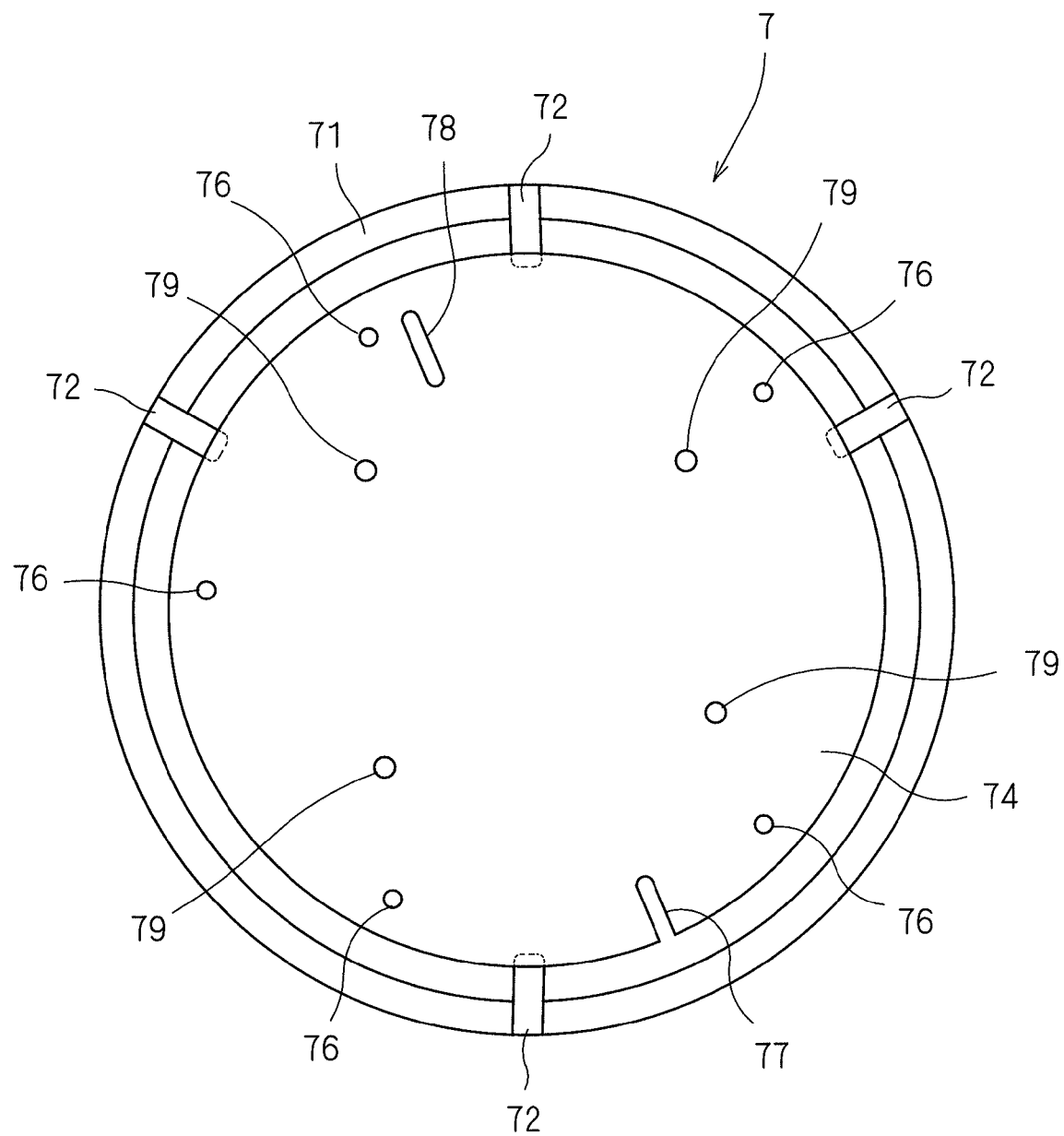
FIG. 3 is a top plan view of the holder.

FIG. 2 is a perspective view showing the entire external appearance of the holder 7. FIG. 3 is a top plan view of the holder 7. FIG. 4 is a side view of the holder 7 as seen from one side. The holder 7 includes a base ring 71, coupling portions 72, and a susceptor 74. The base ring 71, the coupling portions 72, and the susceptor 74 are all made of quartz. In other words, the whole of the holder 7 is made of quartz.

The base ring 71 is a quartz member in the form of an annular ring. The base ring 71 is supported by the wall surface of the chamber 6 by being placed on the bottom surface of the recessed portion 62 (with reference to FIG. 1). The multiple coupling portions 72 (in this preferred embodiment, four coupling portions 72) are mounted upright on the upper surface of the base ring 71 in the form of the annular ring and arranged in a circumferential direction of the base ring 71. The coupling portions 72 are quartz members, and are rigidly secured to the base ring 71 by welding. The base ring 71 may be of an arcuate shape such that a portion is removed from the annular ring.

The planar susceptor 74 is supported by the four coupling portions 72 provided on the base ring 71. The susceptor 74 is a generally circular planar member made of quartz. The diameter of the susceptor 74 is greater than that of a semiconductor wafer W. In other words, the susceptor 74 has a size, as seen in plan view, greater than that of the semiconductor wafer W. Multiple (in this preferred embodiment, five) guide pins 76 are mounted upright on the upper surface of the susceptor 74. The five guide pins 76 are disposed along the circumference of a circle concentric with the outer circumference of the susceptor 74. The diameter of a circle on which the five guide pins 76 are disposed is slightly greater than the diameter of the semiconductor wafer W. The guide pins 76 are also made of quartz. The guide pins 76 may be machined from a quartz ingot integrally with the susceptor 74. Alternatively, the guide pins 76 separately machined may be attached to the susceptor 74 by welding and the like.

The four coupling portions 72 provided upright on the base ring 71 and the lower surface of a peripheral portion of the susceptor 74 are rigidly secured to each other by welding. In other words, the susceptor 74 and the base ring 71 are fixedly coupled to each other with the coupling portions 72, and the holder 7 is an integrally formed member made of quartz. The base ring 71 of such a holder 7 is supported by the wall surface of the chamber 6, whereby the holder 7 is mounted to the chamber 6. With the holder 7 mounted to the chamber 6, the susceptor 74 of a generally disc-shaped configuration assumes a horizontal position (a position such that the normal to the susceptor 74 coincides with a vertical direction). A semiconductor wafer W transported into the chamber 6 is placed and held in a horizontal position on the susceptor 74 of the holder 7 mounted to the chamber 6. The semiconductor wafer W is placed inside the circle defined by the five guide pins 76. This prevents the horizontal misregistration of the semiconductor wafer W. The number of guide pins 76 is not limited to five, but may be determined so as to prevent the misregistration of the semiconductor wafer W.

As shown in FIGS. 2 and 3, an opening 78 and a notch 77 are provided in the susceptor 74 so as to extend vertically through the susceptor 74. The notch 77 is provided to allow a distal end portion of a probe of a contact-type thermometer 130 including a thermocouple to pass therethrough. The opening 78, on the other hand, is provided for a radiation thermometer 120 to receive radiation (infrared radiation) emitted from the lower surface of the semiconductor wafer W held by the susceptor 74. The susceptor 74 further includes four through holes 79 bored therein and designed so that lift pins 12 of the transfer mechanism 10 to be described later pass through the through holes 79, respectively, to transfer a semiconductor wafer W.

Figure 6:
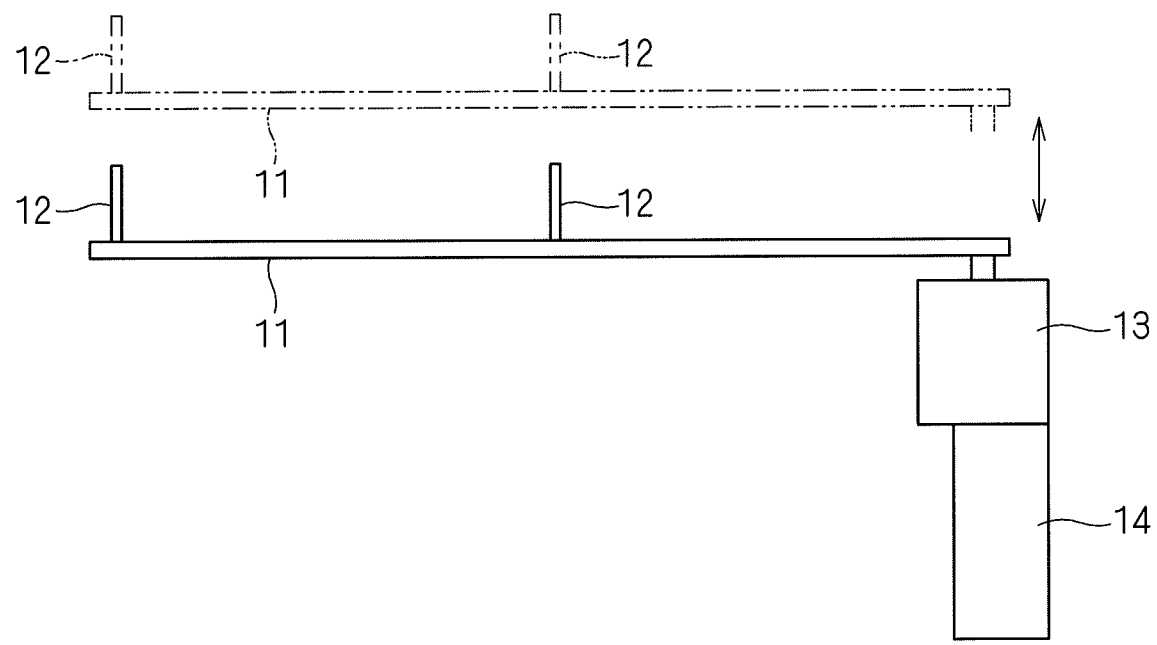
FIG. 6 is a side view of the transfer mechanism.

FIG. 5 is a plan view of the transfer mechanism 10. FIG. 6 is a side view of the transfer mechanism 10. The transfer mechanism 10 includes a pair of transfer arms 11. The transfer arms 11 are of an arcuate configuration extending substantially along the annular recessed portion 62. Each of the transfer arms 11 includes the two lift pins 12 mounted upright thereon. The transfer arms 11 are pivotable by a horizontal movement mechanism 13. The horizontal movement mechanism 13 moves the pair of transfer arms 11 horizontally between a transfer operation position (a position indicated by solid lines in FIG. 5) in which a semiconductor wafer W is transferred to and from the holder 7 and a retracted position (a position indicated by dash-double-dot lines in FIG. 5) in which the transfer arms 11 do not overlap the semiconductor wafer W held by the holder 7 as seen in plan view. The horizontal movement mechanism 13 may be of the type which causes individual motors to pivot the transfer arms 11 respectively or of the type which uses a linkage mechanism to cause a single motor to pivot the pair of transfer arms 11 in cooperative relation.

The transfer arms 11 are moved upwardly and downwardly together with the horizontal movement mechanism 13 by an elevating mechanism 14. As the elevating mechanism 14 moves up the pair of transfer arms 11 in their transfer operation position, the four lift pins 12 in total pass through the respective four through holes 79 (with reference to FIGS. 2 and 3) bored in the susceptor 74 so that the upper ends of the lift pins 12 protrude from the upper surface of the susceptor 74. On the other hand, as the elevating mechanism 14 moves down the pair of transfer arms 11 in their transfer operation position to take the lift pins 12 out of the respective through holes 79 and the horizontal movement mechanism 13 moves the pair of transfer arms 11 so as to open the transfer arms 11, the transfer arms 11 move to their retracted position. The retracted position of the pair of transfer arms 11 is immediately over the base ring 71 of the holder 7. The retracted position of the transfer arms 11 is inside the recessed portion 62 because the base ring 71 is placed on the bottom surface of the recessed portion 62. An exhaust mechanism not shown is also provided near the location where the drivers (the horizontal movement mechanism 13 and the elevating mechanism 14) of the transfer mechanism 10 are provided, and is configured to exhaust an atmosphere around the drivers of the transfer mechanism 10 to the outside of the chamber 6.

Referring again to FIG. 1, the flash heating part 5 provided over the chamber 6 includes an enclosure 51, a light source provided inside the enclosure 51 and including the multiple (in this preferred embodiment, 30) xenon flash lamps FL, and a reflector 52 provided inside the enclosure 51 so as to cover the light source from above. The flash heating part 5 further includes a lamp light radiation window 53 mounted to the bottom of the enclosure 51. The lamp light radiation window 53 forming the floor portion of the flash heating part 5 is a plate-like quartz window made of quartz. The flash heating part 5 is provided over the chamber 6, whereby the lamp light radiation window 53 is opposed to the upper chamber window 63. The flash lamps FL direct a flash of light from over the chamber 6 through the lamp light radiation window 53 and the upper chamber window 63 toward the heat treatment space 65.

The flash lamps FL, each of which is a rod-shaped lamp having an elongated cylindrical shape, are arranged in a plane so that the longitudinal directions of the respective flash lamps FL are in parallel with each other along the main surface of a semiconductor wafer W held by the holder 7 (that is, in a horizontal direction). Thus, a plane defined by the arrangement of the flash lamps FL is also a horizontal plane.

FIG. 8 is a diagram showing a driving circuit for each flash lamp FL. As illustrated in FIG. 8, a capacitor 93, a coil 94, a flash lamp FL, and an IGBT (insulated-gate bipolar transistor) 96 are connected in series. Also as shown in FIG. 8, the controller 3 includes a pulse generator 31 and a waveform setting part 32, and is connected to an input part 33. Examples of the input part 33 used herein include various known input devices such as a keyboard, a mouse, and a touch panel. The waveform setting part 32 sets the waveform of a pulse signal, based on an input from the input part 33, and the pulse generator 31 generates the pulse signal in accordance with that waveform.

The flash lamp FL includes a rod-shaped glass tube (discharge tube) 92 containing xenon gas sealed therein and having positive and negative electrodes provided on opposite ends thereof, and a trigger electrode 91 attached to the outer peripheral surface of the glass tube 92. A power supply unit 95 applies a predetermined voltage to the capacitor 93, and the capacitor 93 is charged in accordance with the applied voltage (charging voltage). A trigger circuit 97 is capable of applying a high voltage to the trigger electrode 91. The timing of the voltage application from the trigger circuit 97 to the trigger electrode 91 is under the control of the controller 3.

The IGBT 96 is a bipolar transistor which includes a MOSFET (metal-oxide-semiconductor field-effect transistor) incorporated in the gate thereof, and is also a switching element suitable for handling a large amount of power. The pulse generator 31 in the controller 3 applies the pulse signal to the gate of the IGBT 96. When a voltage ("high" voltage) not less than a predetermined level is applied to the gate of the IGBT 96, the IGBT 96 turns on. When a voltage ("low" voltage) less than the predetermined level is applied to the gate of the IGBT 96, the IGBT 96 turns off. In this manner, the driving circuit including the flash lamp FL is turned on and off by the IGBT 96. By turning the IGBT 96 on and off, a connection between the flash lamp FL and the capacitor 93 corresponding thereto is made and broken.

Even if, with the capacitor 93 in the charged state, the IGBT 96 turns on to apply a high voltage across the electrodes of the glass tube 92, no electricity will flow through the glass tube 92 in a normal state because the xenon gas is electrically insulative. However, when the trigger circuit 97 applies a high voltage to the trigger electrode 91 to produce an electrical breakdown, an electrical discharge between the electrodes causes a current to flow momentarily in the glass tube 92, so that xenon atoms or molecules are excited at this time to cause light emission.

Also, the reflector 52 shown in FIG. 1 is provided over the plurality of flash lamps FL so as to cover all of the flash lamps FL. A fundamental function of the reflector 52 is to reflect the light emitted from the plurality of flash lamps FL toward the holder 7. The reflector 52 is a plate made of an aluminum alloy. A surface of the reflector 52 (a surface which faces the flash lamps FL) is roughened by abrasive blasting to produce a satin finish thereon.

The multiple (in this preferred embodiment, 40) halogen lamps HL are incorporated in the halogen heating part 4 provided under the chamber 6. The halogen lamps HL direct light from under the chamber 6 through the lower chamber window 64 toward the heat treatment space 65. FIG. 7 is a plan view showing an arrangement of the multiple halogen lamps HL. In this preferred embodiment, 20 halogen lamps HL are arranged in an upper tier, and 20 halogen lamps HL are arranged in a lower tier. Each of the halogen lamps HL is a rod-shaped lamp having an elongated cylindrical shape. The 20 halogen lamps HL in the upper tier and the 20 halogen lamps HL in the lower tier are arranged so that the longitudinal directions thereof are in parallel with each other along a main surface of a semiconductor wafer W held by the holder 7 (that is, in a horizontal direction). Thus, a plane defined by the arrangement of the halogen lamps HL in each of the upper and lower tiers is also a horizontal plane.

As shown in FIG. 7, the halogen lamps HL in each of the upper and lower tiers are disposed at a higher density in a region opposed to the peripheral portion of the semiconductor wafer W held by the holder 7 than in a region opposed to the central portion thereof. In other words, the halogen lamps HL in each of the upper and lower tiers are arranged at shorter intervals in the peripheral portion of the lamp arrangement than in the central portion thereof. This allows a greater amount of light to impinge upon the peripheral portion of the semiconductor wafer W where a temperature decrease is prone to occur when the semiconductor wafer W is heated by the irradiation thereof with light from the halogen heating part 4.

The group of halogen lamps HL in the upper tier and the group of halogen lamps HL in the lower tier are arranged to intersect each other in a lattice pattern. In other words, the 40 halogen lamps HL in total are disposed so that the longitudinal direction of the halogen lamps HL in the upper tier and the longitudinal direction of the halogen lamps HL in the lower tier are orthogonal to each other.

Each of the halogen lamps HL is a filament-type light source which passes current through a filament disposed in a glass tube to make the filament incandescent, thereby emitting light. A gas prepared by introducing a halogen element (iodine, bromine and the like) in trace amounts into an inert gas such as nitrogen, argon and the like is sealed in the glass tube. The introduction of the halogen element allows the temperature of the filament to be set at a high temperature while suppressing a break in the filament. Thus, the halogen lamps HL have the properties of having a longer life than typical incandescent lamps and being capable of continuously emitting intense light. In addition, the halogen lamps HL, which are rod-shaped lamps, have a long life. The arrangement of the halogen lamps HL in a horizontal direction provides good efficiency of radiation toward the semiconductor wafer W provided over the halogen lamps HL.

Also as shown in FIG. 1, the heat treatment apparatus 1 includes the shutter mechanism 2 provided alongside the halogen heating part 4 and the chamber 6. The shutter mechanism 2 includes a shutter plate 21, and a sliding drive mechanism 22. The shutter plate 21 is a plate opaque to halogen light (light from a halogen light source), and is made of titanium (Ti), for example. The sliding drive mechanism 22 causes the shutter plate 21 to slidably move in a horizontal direction, thereby bringing the shutter plate 21 into and out of a light shielding position lying between the halogen heating part 4 and the holder 7. When the sliding drive mechanism 22 moves the shutter plate 21 forward, the shutter plate 21 is inserted into the light shielding position (a position indicated by dash-double-dot lines in FIG. 1) lying between the chamber 6 and the halogen heating part 4 to provide isolation between the lower chamber window 64 and the plurality of halogen lamps HL. Thus, light directed from the plurality of halogen lamps HL toward the holder 7 in the heat treatment space 65 is intercepted. On the other hand, when the sliding drive mechanism 22 moves the shutter plate 21 backward, the shutter plate 21 is retracted from the light shielding position lying between the chamber 6 and the halogen heating part 4 to open the space lying under the lower chamber window 64.

The controller 3 controls the aforementioned various operating mechanisms provided in the heat treatment apparatus 1. The controller 3 is similar in hardware configuration to a typical computer. Specifically, the controller 3 includes a CPU for performing various computation processes, a ROM or read-only memory for storing a basic program therein, a RAM or readable/writable memory for storing various pieces of information therein, and a magnetic disk for storing control software, data and the like therein. The CPU in the controller 3 executes a predetermined processing program, whereby the processes in the heat treatment apparatus 1 proceed. Also, as shown in FIG. 8, the controller 3 includes the pulse generator 31 and the waveform setting part 32. As mentioned earlier, the waveform setting part 32 sets the waveform of the pulse signal, based on an input from the input part 33, and the pulse generator 31 outputs the pulse signal to the gate of the IGBT 96 in accordance with the waveform. The controller 3 and the IGBT 96 constitute a light emission controller for controlling an emission output from each flash lamp FL.

The heat treatment apparatus 1 further includes, in addition to the aforementioned components, various cooling structures to prevent an excessive temperature rise in the halogen heating part 4, the flash heating part 5 and the chamber 6 because of the heat energy generated from the halogen lamps HL and the flash lamps FL during the heat treatment of a semiconductor wafer W. As an example, a water cooling tube (not shown) is provided in the walls of the chamber 6. Also, the halogen heating part 4 and the flash heating part 5 have an air cooling structure for forming a gas flow therein to exhaust heat. Air is supplied to a gap between the upper chamber window 63 and the lamp light radiation window 53 to cool down the flash heating part 5 and the upper chamber window 63.

Figure 9:
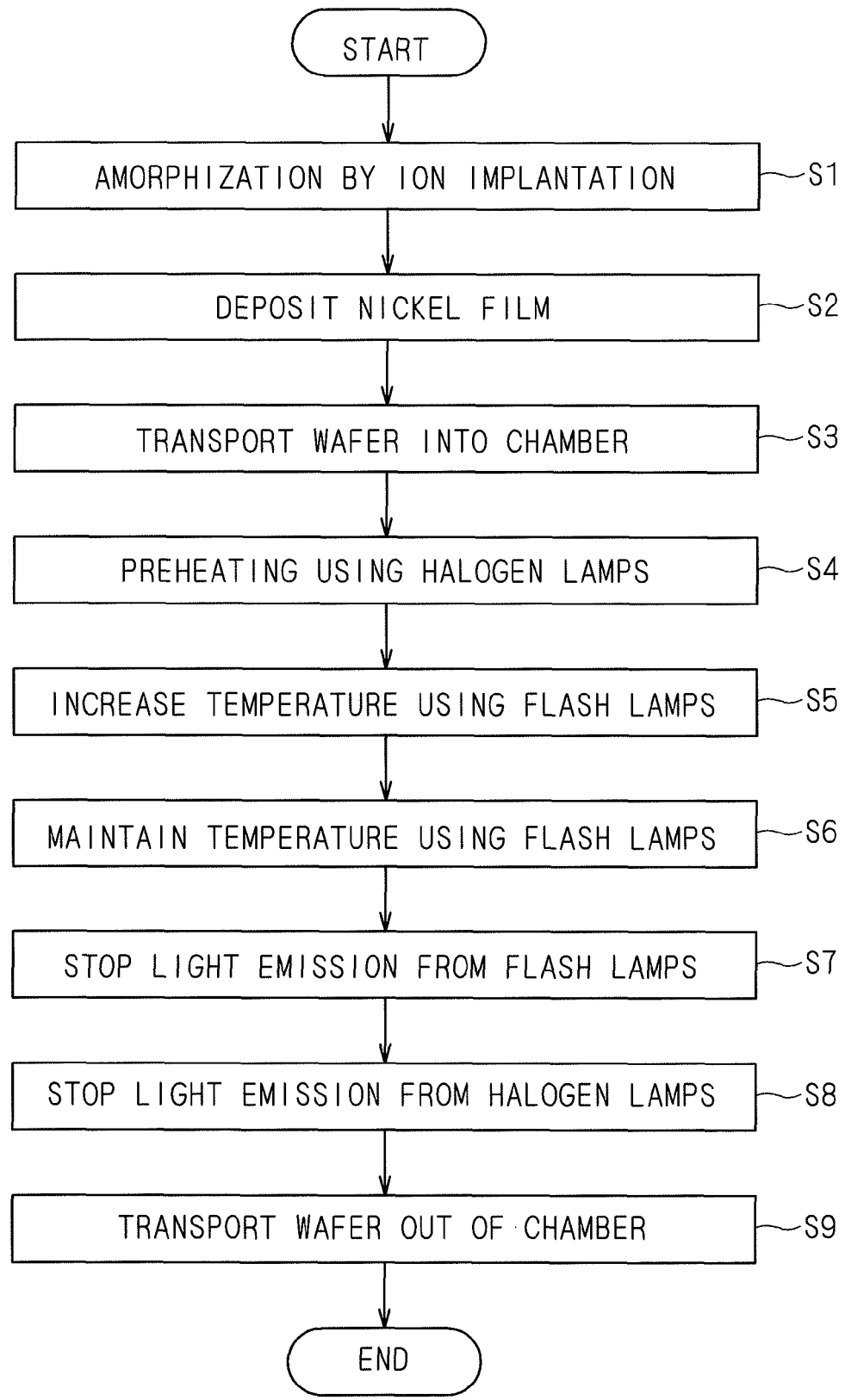
FIG. 9 is a flow diagram showing a treatment procedure for forming nickel silicide in a semiconductor wafer.

Next, a treatment procedure for forming nickel silicide in a semiconductor wafer W will be described. FIG. 9 is a flow diagram showing a treatment procedure for forming nickel silicide in a semiconductor wafer W. Processes in Step S3 and its subsequent steps in FIG. 9 are those performed by the heat treatment apparatus 1. First, ions are implanted into a semiconductor wafer W to amorphize an ion implantation region in the semiconductor wafer W (in Step S1).

Figure 10:
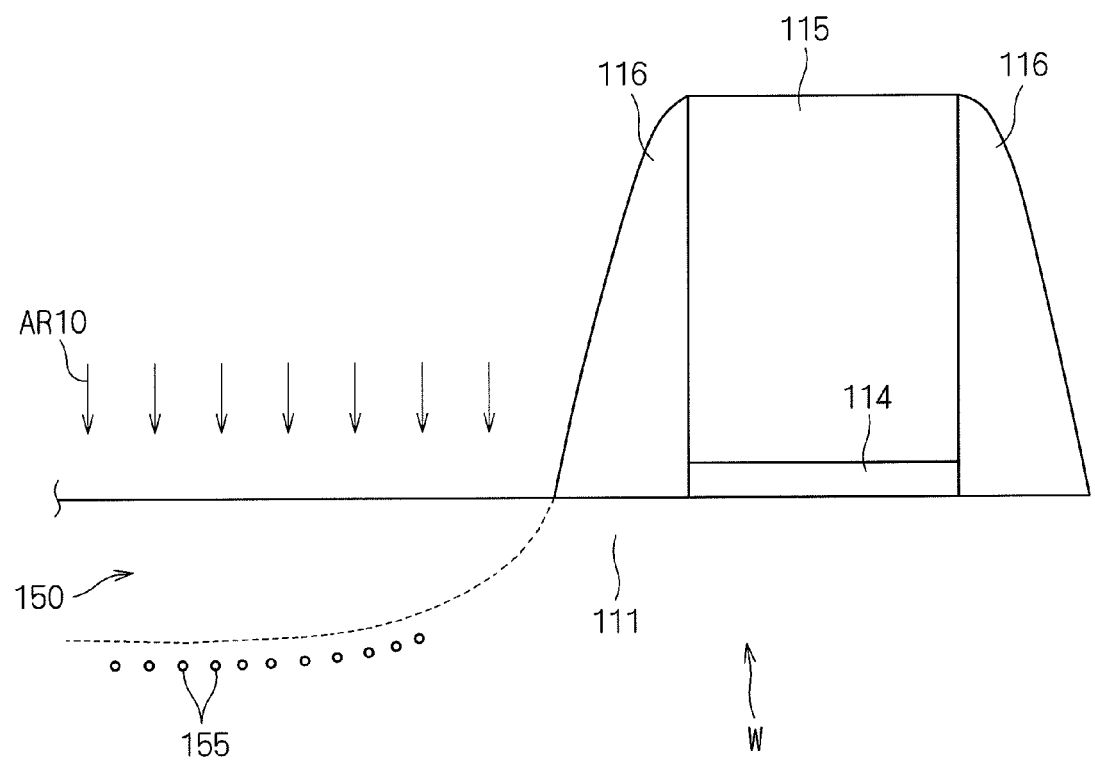
FIG. 10 is a view illustrating an amorphization process performed by ion implantation.

FIG. 10 is a view illustrating an amorphization process performed by ion implantation. The semiconductor wafer W prior to the amorphization process is configured such that a gate electrode 115 is provided over an upper surface of a base material 111 of monocrystalline silicon. The gate electrode 115 made of metal is provided on a gate insulator film 114 which in turn is provided on the base material 111 made of silicon. Side walls 116 made of SiN are formed on the sides of the gate electrode 115. Parts of the base material 111 made of silicon which lie in the upper surface thereof on opposite sides of the gate electrode 115 serve as source/drain regions. In Step S1, ions of one element selected from the group consisting of nitrogen (N), argon (Ar), silicon (Si) and germanium (Ge) are implanted into the source/drain regions, as indicated by arrows AR10 in FIG. 10. The ion implantation may be performed using a known ion implantation apparatus.

The implantation of the ions causes an ion implantation region 150 which has been crystalline to be amorphized, thereby forming amorphous silicon. A boundary between amorphous silicon and crystalline silicon is indicated by a dotted line in FIG. 10. As shown in FIG. 10, point defects 155 known as EOR (end-of-range) defects are formed in some cases near the boundary between amorphous silicon and crystalline silicon (immediately under the amorphous layer).

Next, a nickel film 158 is deposited on the amorphized ion implantation region 150 (in Step S2). FIG. 11 is a view showing the nickel film 158 deposited on the ion implantation region 150. The material of the nickel film 158 deposited in Step S2 is an alloy of nickel (Ni) containing platinum (Pt), cobalt (Co) and titanium (Ti). The nickel film 158 may be deposited by sputtering using a known sputtering apparatus, for example. Alternatively, the nickel film 158 may be deposited by vacuum evaporation. In FIG. 11, the thickness of the nickel film 158 is shown as exaggerated for ease of understanding. In actuality, the thickness of the nickel film 158 is on the order of several to a dozen or so nanometers.

After the completion of the deposition process in Step S2 and its preceding step, the semiconductor wafer W with the nickel film 158 deposited on the amorphized ion implantation region 150 is transported into the aforementioned heat treatment apparatus 1 (in Step S3). The procedure for the operation in the heat treatment apparatus 1 which will be described below proceeds under the control of the controller 3 over the operating mechanisms of the heat treatment apparatus 1.

Prior to the transport of the semiconductor wafer W into the heat treatment apparatus 1, the valve 84 is opened for supply of gas, and the valves 89 and 192 for exhaust of gas are opened, so that the supply and exhaust of gas into and out of the chamber 6 is started in the heat treatment apparatus 1. When the valve 84 is opened, nitrogen gas is supplied through the gas supply opening 81 into the heat treatment space 65. When the valve 89 is opened, the gas within the chamber 6 is exhausted through the gas exhaust opening 86. This causes the nitrogen gas supplied from an upper portion of the heat treatment space 65 in the chamber 6 to flow downwardly and then to be exhausted from a lower portion of the heat treatment space 65.

The gas within the chamber 6 is exhausted also through the transport opening 66 by opening the valve 192. Further, the exhaust mechanism not shown exhausts an atmosphere near the drivers of the transport mechanism 10. It should be noted that the nitrogen gas is continuously supplied into the heat treatment space 65 during the heat treatment of a semiconductor wafer W in the heat treatment apparatus 1. The amount of nitrogen gas supplied into the heat treatment space 65 is changed as appropriate in accordance with the process steps.

Subsequently, the gate valve 185 is opened to open the transport opening 66. A transport robot outside the heat treatment apparatus 1 transports the semiconductor wafer W with the nickel film 158 formed thereon through the transport opening 66 into the heat treatment space 65 in the chamber 6. The semiconductor wafer W transported into the heat treatment space 65 by the transport robot is moved forward to a position lying immediately over the holder 7 and is stopped thereat. Then, the pair of transfer arms 11 of the transfer mechanism 10 is moved horizontally from the retracted position to the transfer operation position and is then moved upwardly, whereby the lift pins 12 pass through the through holes 79 and protrude from the upper surface of the susceptor 74 to receive the semiconductor wafer W.

After the semiconductor wafer W is placed on the lift pins 12, the transport robot moves out of the heat treatment space 65, and the gate valve 185 closes the transport opening 66. Then, the pair of transfer arms 11 moves downwardly to transfer the semiconductor wafer W from the transfer mechanism 10 to the susceptor 74 of the holder 7, so that the semiconductor wafer W is held in a horizontal position. The semiconductor wafer W is held on the susceptor 74 so that a surface thereof where the nickel film 158 is deposited is the upper surface. Also, the semiconductor wafer W is held inside the five guide pins 76 on the upper surface of the susceptor 74. The pair of transfer arms 11 moved downwardly below the susceptor 74 is moved back to the retracted position, i.e. to the inside of the recessed portion 62, by the horizontal movement mechanism 13.

After the semiconductor wafer W is placed and held on the susceptor 74 of the holder 7, the 40 halogen lamps HL in the halogen heating part 4 turn on simultaneously to start preheating (or assist-heating) (in Step S4). Halogen light emitted from the halogen lamps HL is transmitted through the lower chamber window 64 and the susceptor 74 both made of quartz, and impinges upon the back surface of the semiconductor wafer W. The semiconductor wafer W is irradiated with the halogen light from the halogen lamps HL, so that the temperature of the semiconductor wafer W increases. It should be noted that the transfer arms 11 of the transfer mechanism 10, which are retracted to the inside of the recessed portion 62, do not become an obstacle to the heating using the halogen lamps HL.

FIG. 13 is a graph showing changes in the temperature of the front surface of the semiconductor wafer W. After the semiconductor wafer W is transported into the heat treatment space 65 and is placed on the susceptor 74, the controller 3 turns on the 40 halogen lamps HL at time t0, so that the temperature of the semiconductor wafer W irradiated with the halogen light is increased to a preheating temperature T1. The preheating temperature T1 is in the range of room temperature to 300° C., and shall be 200° C. in the present preferred embodiment. The preheating temperature T1 is not more than 300° C., because the preheating temperature T1 exceeding 300° C. causes a reaction to occur between the nickel film 158 and silicon in the ion implantation region 150, resulting in the start of the abnormal lateral growth of nickel silicide.

The temperature of the semiconductor wafer W is measured with the contact-type thermometer 130 when the halogen lamps HL perform preheating. Specifically, the contact-type thermometer 130 incorporating a thermocouple comes through the notch 77 into contact with the lower surface of the semiconductor wafer W held by the susceptor 74 to measure the temperature of the semiconductor wafer W which is on the increase. The measured temperature of the semiconductor wafer W is transmitted to the controller 3. The controller 3 controls the output from the halogen lamps HL while monitoring whether the temperature of the semiconductor wafer W which is on the increase by the irradiation with light from the halogen lamps HL reaches the predetermined preheating temperature T1 or not. In other words, the controller 3 effects feedback control of the output from the halogen lamps HL, based on the value measured with the contact-type thermometer 130, so that the temperature of the semiconductor wafer W is equal to the preheating temperature T1. It should be noted that, when the temperature of the semiconductor wafer W is increased by the irradiation with light from the halogen lamps HL, the temperature is not measured with the radiation thermometer 120. This is because the halogen light emitted from the halogen lamps HL enters the radiation thermometer 120 in the form of disturbance light to obstruct the precise measurement of the temperature.

After the temperature of the semiconductor wafer W reaches the preheating temperature T1, the controller 3 maintains the temperature of the semiconductor wafer W at the preheating temperature T1 for a short time. Specifically, at time t1 when the temperature of the semiconductor wafer W measured with the contact-type thermometer 130 reaches the preheating temperature T1, the controller 3 controls the output from the halogen lamps HL to maintain the temperature of the semiconductor wafer W at approximately the preheating temperature T1.

By performing such preheating using the halogen lamps HL, the temperature of the entire semiconductor wafer W is uniformly increased to the preheating temperature T1. In the stage of preheating using the halogen lamps HL, the semiconductor wafer W shows a tendency to be lower in temperature in a peripheral portion thereof where heat dissipation is liable to occur than in a central portion thereof. However, the halogen lamps HL in the halogen heating part 4 are disposed at a higher density in the region opposed to the peripheral portion of the semiconductor wafer W than in the region opposed to the central portion thereof. This causes a greater amount of light to impinge upon the peripheral portion of the semiconductor wafer W where heat dissipation is liable to occur, thereby providing a uniform in-plane temperature distribution of the semiconductor wafer W in the stage of preheating. Further, the inner peripheral surface of the lower reflective ring 69 mounted to the chamber side portion 61 is provided as a mirror surface. Thus, a greater amount of light is reflected from the inner peripheral surface of the lower reflective ring 69 toward the peripheral portion of the semiconductor wafer W. This provides a more uniform in-plane temperature distribution of the semiconductor wafer W in the stage of preheating.

Next, the flash lamps FL emit a flash of light to perform a heating treatment at time t2 when a predetermined time period has elapsed since the temperature of the semiconductor wafer W reached the preheating temperature T1. It should be noted that a time period required for the temperature of the semiconductor wafer W at room temperature to reach the preheating temperature T1 (a time interval between the time t0 and the time t1) is only on the order of several seconds, and that a time period required between the instant at which the temperature of the semiconductor wafer W reaches the preheating temperature T1 and the instant at which the flash lamps FL emit light (a time interval between the time t1 and the time t2) is also only on the order of several seconds. For flash irradiation from a flash lamp FL, the capacitor 93 is charged in advance by the power supply unit 95. Then, with the capacitor 93 in the charged state, the pulse generator 31 in the controller 3 outputs a pulse signal to the IGBT 96 to drive the IGBT 96 on and off.

Figure 14:
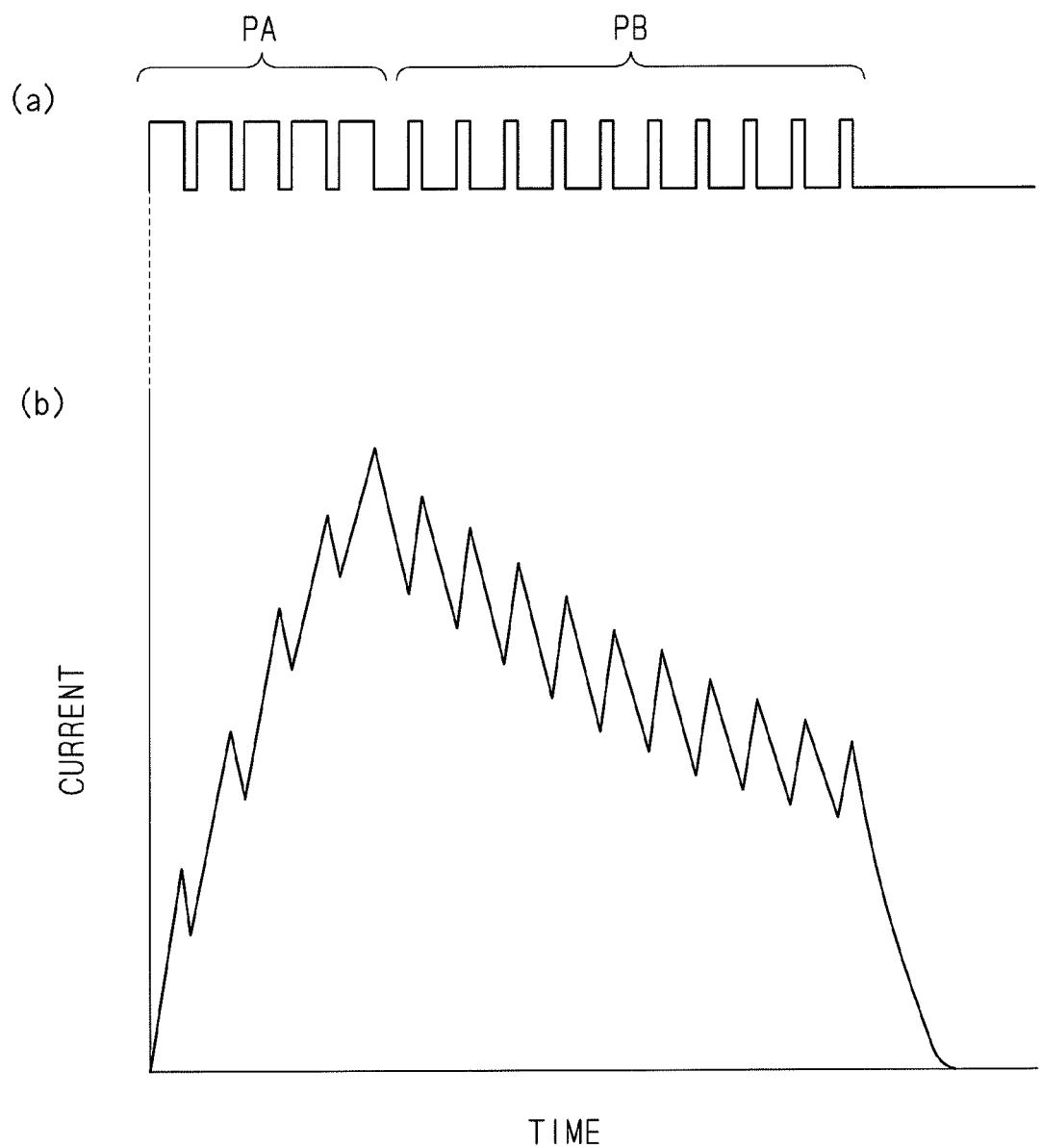
FIG. 14 is a graph showing an example of a correlation between the waveform of a pulse signal and a current flowing through a flash lamp.

FIG. 14 is a graph showing an example of a correlation between the waveform of the pulse signal and a current flowing through a flash lamp FL. In the present preferred embodiment, the pulse signal having a waveform as shown in an upper part of FIG. 14 is outputted from the pulse generator 31. The waveform of the pulse signal is specified by inputting from the input part 33 a recipe that is a sequence of defined parameters including a time interval (ON time) equivalent to the pulse width and a time interval (OFF time) between pulses. After an operator inputs such a recipe from the input part 33 to the controller 3, the waveform setting part 32 in the controller 3 sets a pulse waveform having repeated ON and OFF time intervals as shown in the upper part of FIG. 14 in accordance with the recipe. Pulses PA which are relatively long in pulse width and short in time intervals therebetween are set in an early part of the pulse waveform shown in the upper part of FIG. 14, and pulses PB which are relatively short in pulse width and long in time intervals therebetween are set in a late part thereof Then, the pulse generator 31 outputs the pulse signal in accordance with the pulse waveform set by the waveform setting part 32. As a result, the pulse signal having the waveform as shown in the upper part of FIG. 14 is applied to the gate of the IGBT 96 to control the driving on and off of the IGBT 96. Specifically, the IGBT 96 is on when the pulse signal inputted to the gate of the IGBT 96 is on, and the IGBT 96 is off when the pulse signal is off.

In synchronism with the turning on of the pulse signal outputted from the pulse generator 31, the controller 3 controls the trigger circuit 97 to apply a high voltage (trigger voltage) to the trigger electrode 91. The pulse signal is inputted to the gate of the IGBT 96, with the electrical charges stored in the capacitor 93, and the high voltage is applied to the trigger electrode 91 in synchronism with the turning on of the pulse signal, whereby a current flows across the electrodes of the glass tube 92 whenever the pulse signal is on. The resultant excitation of xenon atoms or molecules induces light emission.

The pulse signal having the waveform shown in the upper part of FIG. 14 is outputted from the controller 3 to the gate of the IGBT 96, and the high voltage is applied to the trigger electrode 91 in synchronism with the turning on of the pulse signal, whereby a current having a waveform as shown in a lower part of FIG. 14 flows through the circuit including the flash lamp FL. Specifically, the value of the current flowing in the glass tube 92 of the flash lamp FL increases when the pulse signal inputted to the gate of the IGBT 96 is on, and decreases when the pulse signal is off. It should be noted that an individual current waveform corresponding to each pulse is defined by the constant of the coil 94.

Figure 15:
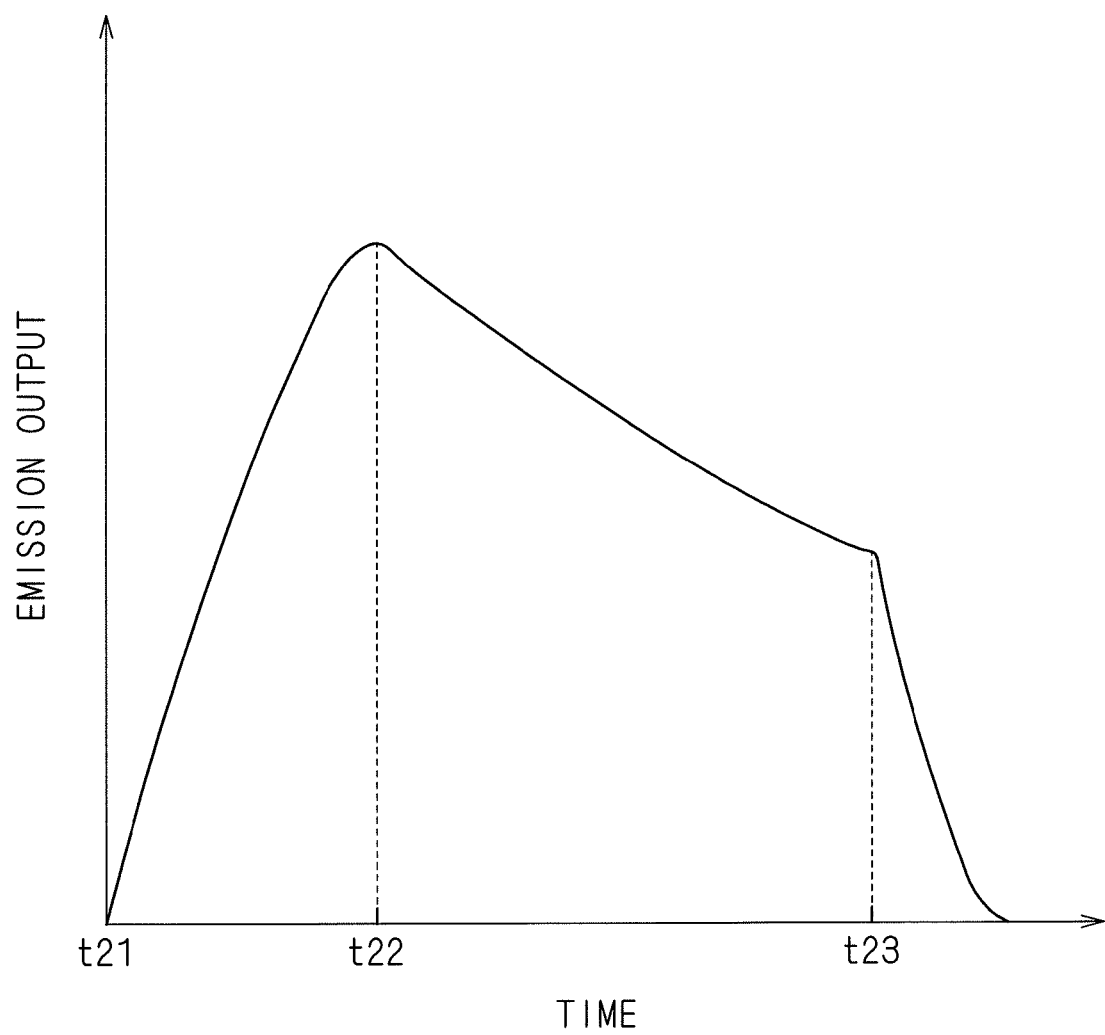
FIG. 15 is a graph showing an example of an emission output profile of a flash lamp.

The current having the waveform shown in the lower part of FIG. 14 flows, so that the flash lamp FL emits light. The emission output from the flash lamp FL is roughly proportional to the current flowing through the flash lamp FL. Thus, the output waveform (profile) of the emission output from the flash lamp FL has a pattern as shown in FIG. 15. The semiconductor wafer W held by the holder 7 is irradiated with light in accordance with the output waveform from the flash lamp FL as shown in FIG. 15.

If the flash lamp FL emits light without using the IGBT 96, the electrical charges stored in the capacitor 93 are consumed momentarily by emitting light only once, so that the output waveform from the flash lamp FL exhibits a single pulse having a width on the order of 0.1 to 10 milliseconds. On the other hand, the IGBT 96 serving as a switching element is connected in the circuit and the pulse signal as shown in the upper part of FIG. 14 is outputted to the gate of the IGBT 96 according to the present preferred embodiment. Thus, the IGBT 96 intermittently supplies the electrical charges from the capacitor 93 to the flash lamp FL to control the current flowing to the flash lamp FL. As a result, the light emission from the flash lamp FL is accordingly chopper-controlled, which allows the electrical charges stored in the capacitor 93 to be consumed in a divided manner. This enables the flash lamp FL to repeatedly flash on and off in an extremely short time. It should be noted that, before the value of the current reaches exactly zero, the next pulse is applied to the gate of the IGBT 96 to increase the current value again, as shown in the lower part of FIG. 14. For this reason, the emission output never reaches exactly zero even while the flash lamp FL repeatedly flashes on and off.

The output waveform of light shown in FIG. 15 may be regarded to show that two-stage irradiation with light is performed. Specifically, the two-stage irradiation includes a first stage of irradiation (first irradiation) from time t21 at which the flash lamp FL starts emitting light to time t22 at which the emission output is at its maximum, and a second stage of irradiation (second irradiation) from the time t22 to time t23 during which the emission output decreases gradually.

More specifically, the pulse generator 31 first intermittently applies the pulses PA which are relatively long in pulse width and short in time intervals therebetween to the gate of the IGBT 96 to cause the IGBT 96 to repeatedly turn on and off, whereby a current flows through the circuit including the flash lamp FL. At this stage, because the pulses PA which are relatively long in pulse width and short in time intervals therebetween are applied to the gate of the IGBT 96, the ON time of the IGBT 96 is longer than the OFF time thereof, so that the current flowing through the flash lamp FL has a sawtooth waveform which increases as seen in general view (as shown in an early part of the lower part of FIG. 14). The flash lamp FL through which the current having such a waveform flows performs the first irradiation such that the emission output increases from the time t21 to the time t22.

Next, the pulse generator 31 intermittently applies the pulses PB which are relatively short in pulse width and long in time intervals therebetween to the gate of the IGBT 96. At this stage, because the pulses PB which are relatively short in pulse width and long in time intervals therebetween are applied to the gate of the IGBT 96, the ON time of the IGBT 96 is shorter than the OFF time thereof in a manner contrary to the above, so that the current flowing through the flash lamp FL has a sawtooth waveform which decreases gradually as seen in general view (as shown in a late part of the lower part of FIG. 14). The flash lamp FL through which the current having such a waveform flows performs the second irradiation such that the emission output decreases gradually from the time t22 to the time t23.

By performing the two-stage irradiation with light as shown in FIG. 15 on the semiconductor wafer W, the temperature of the front surface of the semiconductor wafer W increases from the preheating temperature T1 to a target temperature T2, and the temperature profile thereof has a pattern as shown in FIG. 16. More specifically, the first irradiation performed from the time t21 to the time t22 causes the temperature of the front surface of the semiconductor wafer W to increase from the preheating temperature T1 to the target temperature T2 (in Step S5). The target temperature T2 is in the range of 600° C. to 1100° C. where the base material 111 of silicon and the nickel film 158 react with each other to form nickel silicide, and shall be 900° C. in the present preferred embodiment. The time period from the time t21 to the time t22 during which the temperature of the front surface of the semiconductor wafer W is increased by the first irradiation is in the range of 1 to 20 milliseconds.

The second irradiation performed from the time t22 to the time t23 maintains the temperature of the front surface of the semiconductor wafer W within a ±25° C. range around the target temperature T2 (in Step S6). The time period from the time t22 to the time t23 during which the temperature of the front surface of the semiconductor wafer W is maintained within a ±25° C. range around the target temperature T2 is in the range of 1 to 100 milliseconds. It should be noted that the graph of FIG. 13 is plotted with a time scale of seconds, whereas the graph of FIG. 16 is plotted with a time scale of milliseconds. Thus, the times t21 to t23 in FIG. 16 are shown as substantially overlaid on the time t2 in FIG. 13.

After the second irradiation using the flash lamp FL is completed, the IGBT 96 turns off to stop the light emission from the flash lamp FL (in Step S7). Then, the temperature of the front surface of the semiconductor wafer W decreases rapidly from the target temperature T2. Referring again to FIG. 13, the halogen lamps HL turn off at time t3 which is a predetermined time period later than the completion of the second irradiation (in Step S8). This causes the temperature of the semiconductor wafer W to start decreasing from the preheating temperature T1. At the same time that the halogen lamps HL turn off, the shutter mechanism 2 inserts the shutter plate 21 into the light shielding position lying between the halogen heating part 4 and the chamber 6. The temperatures of filaments and tube walls of the halogen lamps HL do not decrease immediately after the halogen lamps HL turn off, but radiant heat is continuously emitted from the filaments and the tube walls at elevated temperature for a short time interval to obstruct the temperature decrease of the semiconductor wafer W. The insertion of the shutter plate 21 interrupts the radiant heat emitted from the halogen lamps HL immediately after the turning off toward the heat treatment space 65 to increase the rate at which the temperature of the semiconductor wafer W decreases.

The controller 3 monitors whether the temperature of the semiconductor wafer W measured with the contact-type thermometer 130 decreases to a predetermined temperature or not. After the temperature of the semiconductor wafer W decreases to the predetermined temperature or below, the pair of transfer arms 11 of the transfer mechanism 10 is moved horizontally again from the retracted position to the transfer operation position and is then moved upwardly, whereby the lift pins 12 protrude from the upper surface of the susceptor 74 to receive the heat-treated semiconductor wafer W from the susceptor 74. Subsequently, the transport opening 66 which has been closed is opened by the gate valve 185, and the transport robot outside the heat treatment apparatus 1 transports the semiconductor wafer W placed on the lift pins 12 to the outside (in Step S9). Thus, the heat treatment apparatus 1 completes the heating treatment of the semiconductor wafer W.

In the present preferred embodiment, ions of nitrogen, argon, silicon, germanium and the like are implanted into the source/drain regions in the semiconductor wafer W to amorphize the ion implantation region 150 in the semiconductor wafer W. Then, the nickel film 158 is deposited on the amorphized ion implantation region 150. The semiconductor wafer W with the nickel film 158 deposited thereon in this manner is transported into the heat treatment apparatus 1, and is then heated by the flash irradiation from the flash lamps FL.

For the flash irradiation, the first irradiation is initially performed in such a manner that the pulses PA which are relatively long in pulse width and short in time intervals therebetween are intermittently applied to the gate of the IGBT 96 whereby the emission output from the flash lamp FL is increased from zero up to a maximum value over a time period in the range of 1 to 20 milliseconds. Such first irradiation causes the temperature of the front surface of the semiconductor wafer W to increase from the preheating temperature T1 to the target temperature T2 for the time period in the range of 1 to 20 milliseconds (in the present preferred embodiment, to increase by 700° C.).

By increasing the temperature of the front surface of the semiconductor wafer W to the target temperature T2, amorphous silicon in the amorphized ion implantation region 150 and the nickel film 158 react with each other to form nickel silicide. Also, the increase in the temperature of the front surface of the semiconductor wafer W from the preheating temperature T1 to the target temperature T2 over a time period not less than 1 millisecond prevents the occurrence of process-induced damage to a device (the gate electrode 115 and the like) formed on the front surface of the semiconductor wafer W. If the time period for which the temperature of the front surface of the semiconductor wafer W is increased from the preheating temperature T1 to the target temperature T2 is less than 1 millisecond, there is a danger that nickel silicide is not uniformly formed. Also, if the time period for which the temperature is increased is less than 1 millisecond, abrupt thermal expansion causes the semiconductor wafer W to become warped, so that the distortion applied to the gate and the source/drain regions is changed. As a result, there is a danger that the characteristics of devices produced from the semiconductor wafer W are degraded. On the other hand, if the time period for which the temperature of the front surface of the semiconductor wafer W is increased from the preheating temperature T1 to the target temperature T2 is more than 20 milliseconds, there is apprehension that nickel is excessively diffused from the nickel film 158 to make the film of nickel silicide too thick. Also, there is a danger that impurities implanted into the source/drain regions are diffused deeply to make a junction too deep. For these reasons, the time period for which the temperature of the front surface of the semiconductor wafer W is increased from the preheating temperature T1 to the target temperature T2 shall be in the range of 1 to 20 milliseconds.

Next, after the temperature of the front surface of the semiconductor wafer W is increased from the preheating temperature T1 to the target temperature T2, the second irradiation is performed in such a manner that the pulses PB which are relatively short in pulse width and long in time intervals therebetween are intermittently applied to the gate of the IGBT 96 whereby the emission output from the flash lamp FL is decreased gradually from the maximum value over a time period in the range of 1 to 100 milliseconds. Such second irradiation maintains the temperature of the front surface of the semiconductor wafer W within a ±25° C. range around the target temperature T2 for the time period in the range of 1 to 100 milliseconds.

Figure 12:
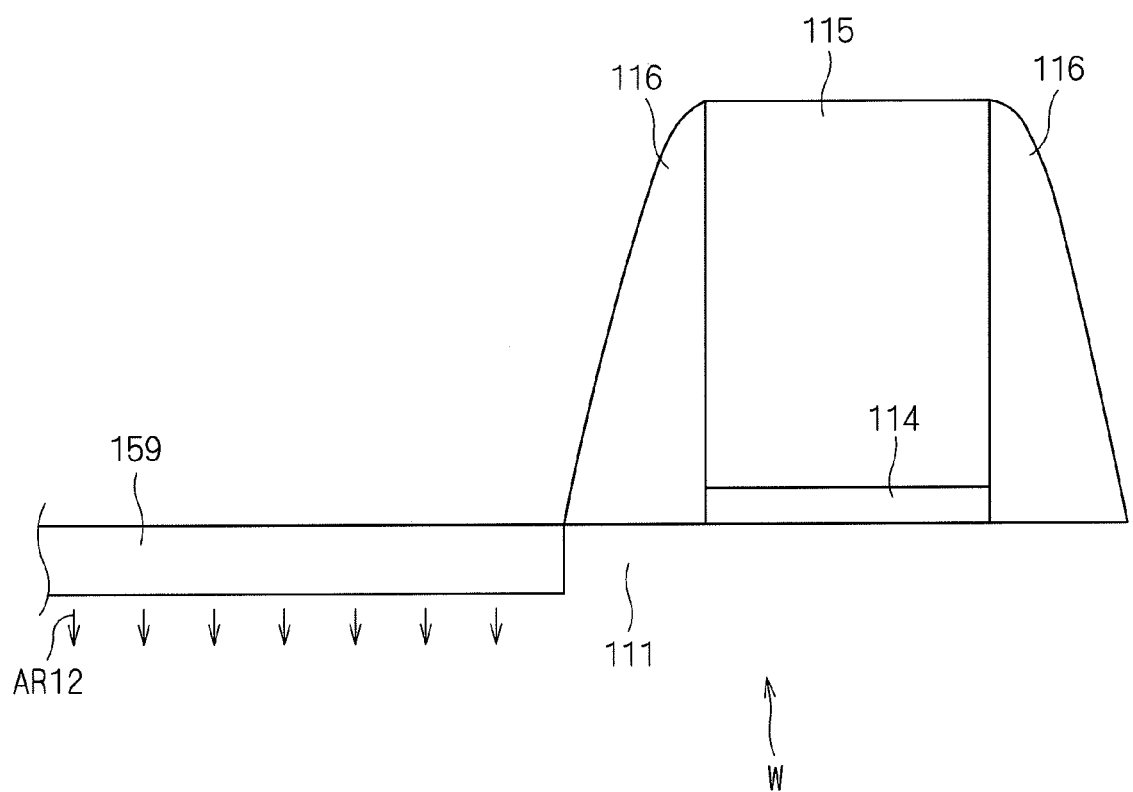
FIG. 12 is a view showing the growth of nickel silicide.

Nickel silicide is grown by maintaining the temperature of the front surface of the semiconductor wafer W near the target temperature T2 for the time period in the range of 1 to 100 milliseconds. FIG. 12 is a view showing the growth of nickel silicide. The front surface of the semiconductor wafer W is heated to near the target temperature T2, whereby nickel silicide 159 grows preferentially in a direction perpendicular to the semiconductor wafer W (in the direction of the thickness of the semiconductor wafer W), as indicated by arrows AR12 in FIG. 12. That is, the nickel silicide 159 grows little in a lateral direction (toward the gate electrode 115), as compared with that in the perpendicular direction. This results from the fact that the amorphization process in Step S1 amorphizes the ion implantation region 150 immediately under the nickel film 158 to make the crystallinity of the ion implantation region 150 poorer.

Also, maintaining the temperature of the front surface of the semiconductor wafer W near the target temperature T2 for the time period in the range of 1 to 100 milliseconds reduces the point defects 155 created near the boundary between amorphous silicon and crystalline silicon (with reference to FIGS. 10 and 11). If the time period for which the temperature of the front surface of the semiconductor wafer W is maintained within a ±25° C. range around the target temperature T2 is less than 1 millisecond, there is a danger that the point defects 155 are not sufficiently reduced. On the other hand, if this time period is greater than 100 milliseconds, there is a danger that the nickel silicide 159 grows abnormally also in the lateral direction. The time period in the range of 1 to 100 milliseconds for which the temperature of the front surface of the semiconductor wafer W is maintained within a ±25° C. range around the target temperature T2 allows the formation of the nickel silicide 159 in the front surface of the semiconductor wafer W while preventing the nickel silicide 159 from abnormally growing in the lateral direction. Such a time period further reduces the point defects 155 introduced in the ion implantation step (Step S1). As a result, the increase in leakage current is suppressed. For these reasons, the time period for which the temperature of the front surface of the semiconductor wafer W is maintained within a ±25° C. range around the target temperature T2 shall be in the range of 1 to 100 milliseconds.

The provision of the temperature maintaining step for maintaining the temperature of the front surface of the semiconductor wafer W within a ±25° C. range around the target temperature T2 for the time period in the range of 1 to 100 milliseconds facilitates a simulation of heat conduction in the semiconductor wafer W and the like, as compared with an instance where the temperature of the front surface decreases immediately after the target temperature T2 is reached. As a result, phenomena resulting from the heating treatment are precisely analyzed.

While the preferred embodiment according to the present invention has been described hereinabove, various modifications of the present invention in addition to those described above may be made without departing from the scope and spirit of the invention. For example, in the aforementioned preferred embodiment, the temperature of the front surface of the semiconductor wafer W is increased from the preheating temperature T1 to the target temperature T2 by the first irradiation, and is then maintained near the target temperature T2 by the second irradiation subsequent to the first irradiation. However, the temperature maintained by the second irradiation is not limited to the target temperature T2. As an example, when the temperature of the front surface of the semiconductor wafer W is decreased by 50° C. to 200° C. from the target temperature T2 following a slight time interval after reaching the target temperature T2, the second irradiation may be started to maintain the temperature of the front surface of the semiconductor wafer W within a ±25° C. range around the decreased temperature (a second target temperature).

The nickel film 158 is deposited in Step S2 in the aforementioned preferred embodiment. In place of the nickel film 158, a film of other metals for use in silicide technology, e.g. cobalt (Co), titanium (Ti) and tungsten (W), may be deposited on the amorphized ion implantation region 150.

When a cobalt film is formed in place of the nickel film 158 on the ion implantation region 150, the preheating temperature T1 is in the range of room temperature to 500° C. That is, the cobalt film is capable of suppressing the abnormal growth of silicide even when preheated to a relatively high temperature, as compared with the nickel film. The target temperature T2 for the cobalt film is in the range of 600° C. to 1100° C. which is similar to that for the nickel film.

When a titanium film is formed in place of the nickel film 158 on the ion implantation region 150, the preheating temperature T1 is in the range of room temperature to 500° C. which is similar to that for the cobalt film. The target temperature T2 for the titanium film is in the range of 600° C. to 1100° C. which is similar to that for the nickel film.

When a tungsten film is formed in place of the nickel film 158 on the ion implantation region 150, the preheating temperature T1 is in the range of room temperature to 700° C. This is because, in the case of the tungsten film, the abnormal growth of silicide does not occur until a considerably high temperature is reached. The target temperature T2 for the tungsten film is in the range of 900° C. to 1100° C.

Also, the process for setting the waveform of the pulse signal is not limited to inputting the parameters including the pulse width and the like one by one from the input part 33. For example, the setting of the waveform may be done by an operator inputting the waveform directly in graphical form from the input part 33, by reading the waveform previously set and stored in a storage part such as a magnetic disk and the like, or by downloading the waveform from outside the heat treatment apparatus 1.

Further, although the voltage is applied to the trigger electrode 91 in synchronism with the turning on of the pulse signal in the aforementioned preferred embodiment, the timing of the application of the trigger voltage is not limited to this. The trigger voltage may be applied at fixed time intervals independently of the waveform of the pulse signal. In a case where the pulse signal is short in time intervals or where the passage of current is started by a pulse while the value of the current caused to flow through the flash lamp FL by the preceding pulse is not less than a predetermined value, the current continues to flow through the flash lamp FL without interruption. In such a case, it is not necessary to apply the trigger voltage for each pulse. In a case where all of the pulse intervals of the pulse signal are shorter than a predetermined value as shown in FIG. 14 according to the aforementioned preferred embodiment, the trigger voltage may be applied only when the first pulse is applied. Thereafter, the current waveform as shown in the lower part of FIG. 14 is provided only by outputting the pulse signal as shown in the upper part of FIG. 14 to the gate of the IGBT 96 without the application of the trigger voltage. In other words, the timing of the application of the trigger voltage may be arbitrarily determined as long as the timing of the current flow through the flash lamp FL coincides with the turning on of the pulse signal.

Although the IGBT 96 is used as a switching element in the aforementioned preferred embodiment, another transistor capable of turning on and off the circuit in accordance with the signal level inputted to the gate thereof may be used in place of the IGBT 96. It is, however, preferable to use an IGBT and a GTO (gate turn-off) thyristor which are suitable for handling high power as a switching element because the emission of light from the flash lamps FL consumes considerably high power.

Also, a circuit configuration different from that shown in FIG. 8 may be employed as long as multi-stage irradiation with light from the flash lamp FL is achieved. For example, a plurality of power supply circuits having different coil constants may be connected to a single flash lamp FL. Also, as long as the multi-stage irradiation with light is achieved, the light source is not limited to the flash lamp FL, but is required only to be capable of emitting light for not more than 1 second. As an example, a laser may be used as the light source.

Although the 30 flash lamps FL are provided in the flash heating part 5 according to the aforementioned preferred embodiment, the present invention is not limited to this. Any number of flash lamps FL may be provided. The flash lamps FL are not limited to the xenon flash lamps, but may be krypton flash lamps. Also, the number of halogen lamps HL provided in the halogen heating part 4 is not limited to 40. Any number of halogen lamps HL may be provided.

Also, in the aforementioned preferred embodiment, the semiconductor wafer W is preheated by irradiating the semiconductor wafer W with halogen light from the halogen lamps HL. The technique for preheating is not limited to this, but the semiconductor wafer W may be preheated by placing the semiconductor wafer W on a hot plate.

Moreover, a substrate to be treated by the heat treatment apparatus according to the present invention is not limited to a semiconductor wafer, but may be a glass substrate for use in a flat panel display for a liquid crystal display apparatus and the like, and a substrate for a solar cell.

While the invention has been described in detail, the foregoing description is in all aspects illustrative and not restrictive. It is understood that numerous other modifications and variations can be devised without departing from the scope of the invention.

What is claimed is:

1. A method of heating a substrate of silicon to grow a silicide, said method comprising the steps of:
   (a) implanting ions into said substrate to amorphize an ion implantation region in said substrate;
   (b) depositing a metal film on the amorphized ion implantation region;
   (c) heating said substrate with said metal film formed thereon at a predetermined preheating temperature;
   (d) irradiating said substrate with light to increase the temperature of a front surface of said substrate from said preheating temperature to a target temperature for a time period in the range of 1 to 20 milliseconds; and
   (e) irradiating said substrate with light to maintain the temperature of the front surface of said substrate within a ±25° C. range around said target temperature for a time period in the range of 1 to 100 milliseconds, said step (e) being performed after said step (d).

2. The method according to claim 1, wherein:
   a film of nickel is deposited in said step (b);

said preheating temperature is not greater than 300° C.; and
said target temperature is in the range of 600° C. to 1100° C.

3. The method according to claim 1, wherein:
a film of titanium is deposited in said step (b);
said preheating temperature is not greater than 500° C.; and
said target temperature is in the range of 600° C. to 1100° C.

4. The method according to claim 1, wherein:
a film of cobalt is deposited in said step (b);
said preheating temperature is not greater than 500° C.; and
said target temperature is in the range of 600° C. to 1100° C.

5. The method according to claim 1, wherein:
a film of tungsten is deposited in said step (b);
said preheating temperature is not greater than 700° C.; and
said target temperature is in the range of 900° C. to 1100° C.

6. The method according to claim 1, wherein
said substrate is irradiated with a flash of light from a flash lamp in said step (d) and in said step (e).

7. The method according to claim 1, wherein
ions of one element selected from the group consisting of nitrogen, argon, silicon and germanium are implanted in said step (a).

8. The method according to claim 6, wherein
a switching element intermittently supplies electrical charges from a capacitor to said flash lamp to control an emission output from said flash lamp in said step (d) and in said step (e).

* * * * *